United States Patent [19]
Ogawa et al.

[11] Patent Number: 6,025,614
[45] Date of Patent: Feb. 15, 2000

[54] AMPLIFIER SEMICONDUCTOR ELEMENT, METHOD FOR FABRICATING THE SAME, AND AMPLIFIER SEMICONDUCTOR DEVICE

[75] Inventors: Minoru Ogawa, Ikoma-gun; Nobuyuki Matsumoto, Nara; Takao Hasegawa, Tondabayashi; Kazuhiko Shirakawa, Ikoma-gun, all of Japan

[73] Assignee: Sharp Kabushiki Kaisha, Osaka, Japan

[21] Appl. No.: 09/050,431

[22] Filed: Mar. 31, 1998

[30] Foreign Application Priority Data

Mar. 31, 1997 [JP] Japan .................................. 9-081588
Mar. 26, 1998 [JP] Japan ................................. 10-079210

[51] Int. Cl.[7] ...................... H01L 31/0328; H01L 31/072
[52] U.S. Cl. ............................. 257/192; 257/196
[58] Field of Search ................................... 257/402, 403, 257/404, 192, 194, 196

[56] References Cited

U.S. PATENT DOCUMENTS

| Re. 33,584 | 5/1991 | Mimura | 257/194 |
|---|---|---|---|
| 4,916,500 | 4/1990 | Yazawa et al. | 257/260 |
| 4,990,974 | 2/1991 | Vinal | 257/403 |
| 5,300,795 | 4/1994 | Saunier et al. | 257/192 |
| 5,440,160 | 8/1995 | Vinal | 257/327 |
| 5,486,710 | 1/1996 | Kitano | 257/192 |
| 5,675,172 | 10/1997 | Miyamoto et al. | 257/402 |

FOREIGN PATENT DOCUMENTS 3233942  10/1991  Japan .

OTHER PUBLICATIONS

Silicon Processing for the VLSI Era, S. Wolf, 1990, pp. 301–305.

1993 Electronic Information Communication Society Autumn Convention, C–376 M. Nagaoka et al. (Partial Translation).

Power Heterojunction FETs for Low–Voltage Digital Cellular Applications IEICE Trans. Electron. vol. E78C, No. 9, pp. 1241–1245, Sep. 1995.

Primary Examiner—Jerome Jackson, Jr.
Assistant Examiner—George C. Eckert, II

[57] ABSTRACT

The amplifier semiconductor element of this invention includes a field effect transistor of which a threshold voltage $V_{th}$ has a predetermined relationship with an operating voltage.

5 Claims, 23 Drawing Sheets

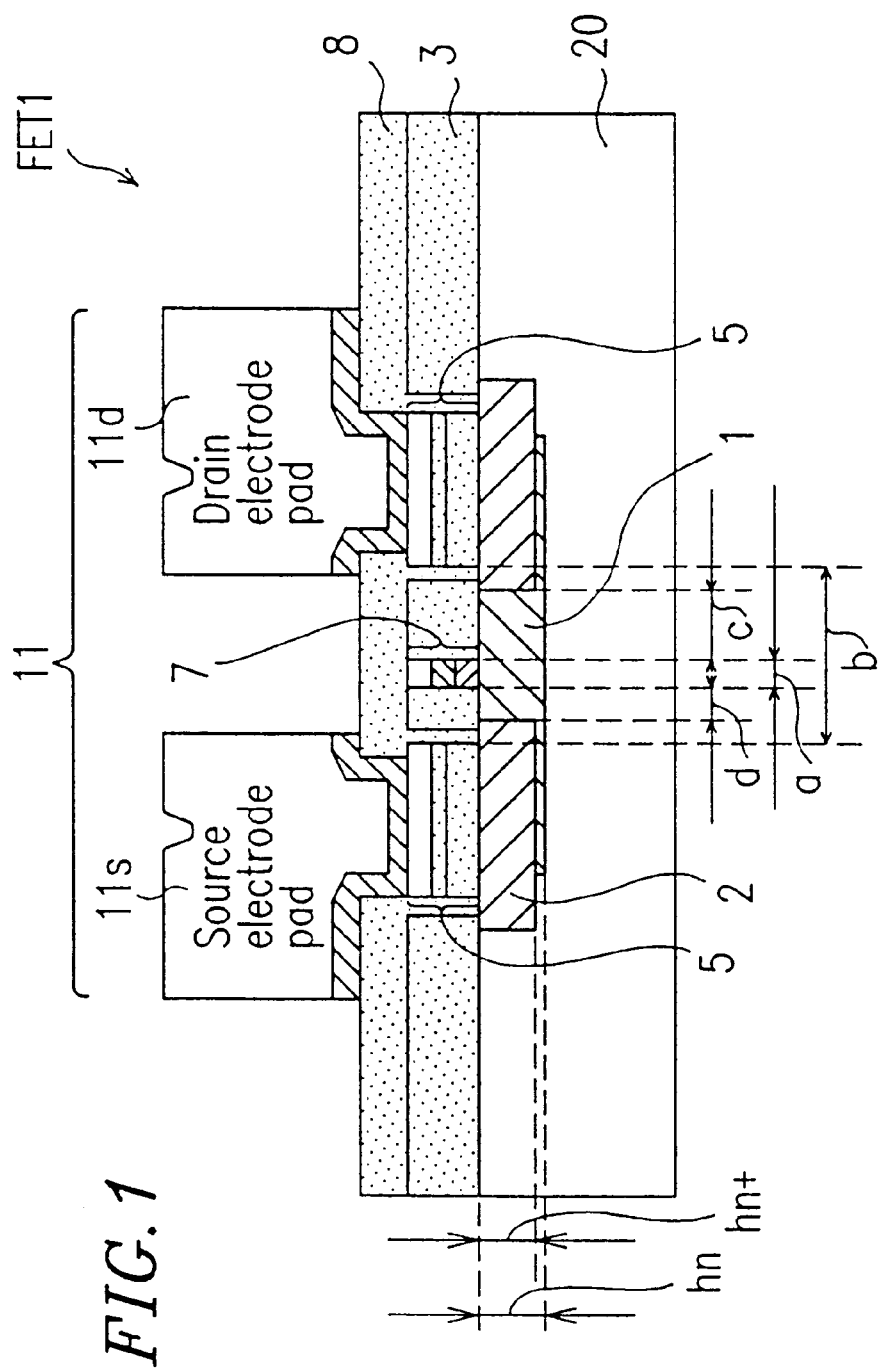

Conceptual view of the effect of decreasing the amount of parasitic components according to the present invention

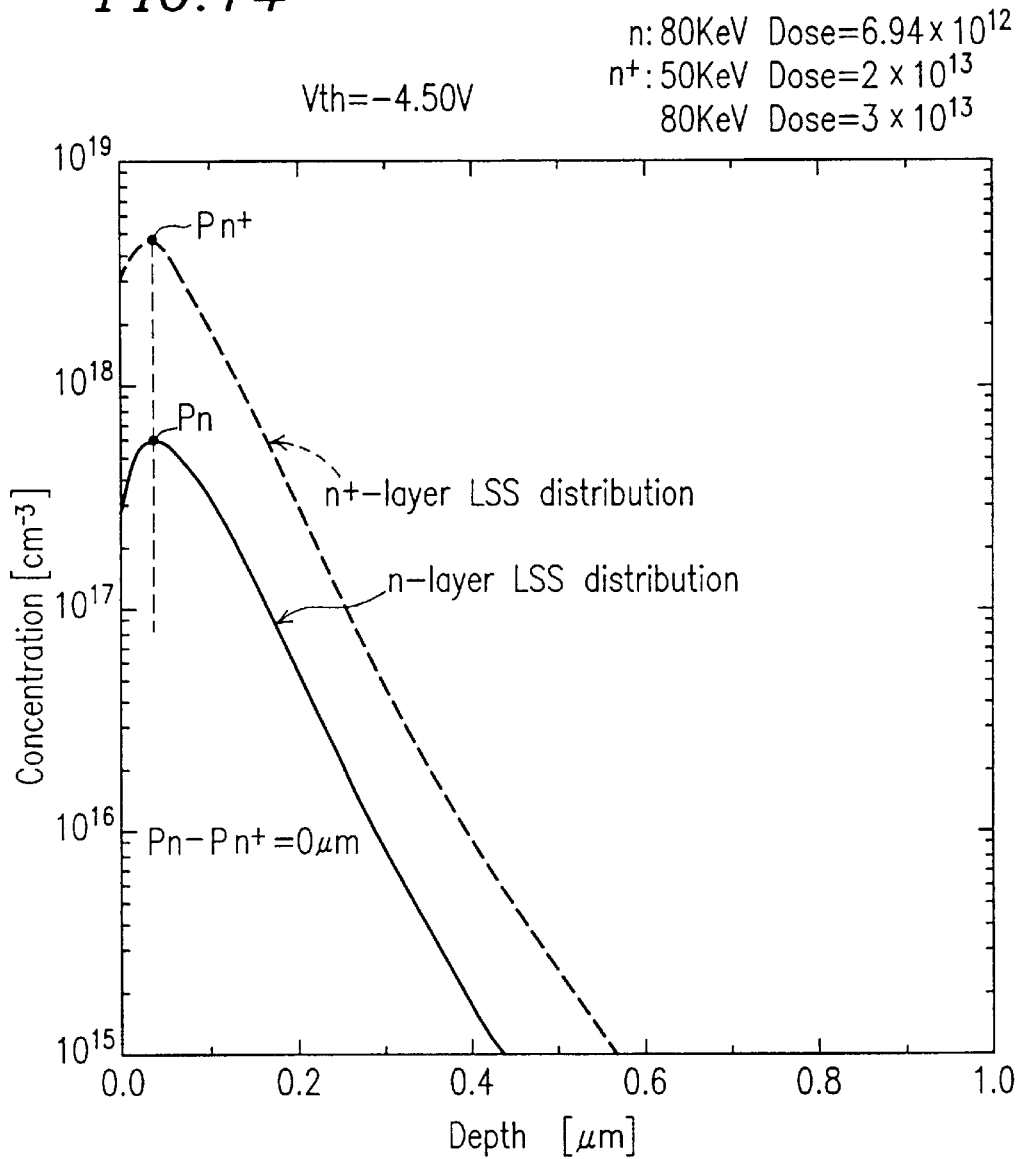

LSS distribution when n-layer ion implantation energy is 120KeV

LSS distribution when n-layer ion implantation energy is 150KeV

Dependency of Vg-gm curve on
n-layer ion implantation energy

AMPLIFIER SEMICONDUCTOR ELEMENT, METHOD FOR FABRICATING THE SAME, AND AMPLIFIER SEMICONDUCTOR DEVICE

BACKGROUND OF THE INVENTION

1. Field of the Invention

The present invention relates to an amplifier semiconductor element for linear amplification, a method for fabricating such an amplifier semiconductor element, and an amplifier semiconductor device. More particularly, the present invention relates to an amplifier semiconductor element which is fabricated by an ion implantation process, a method for fabricating such an amplifier semiconductor element, and an amplifier semiconductor device.

2. Description of the Related Art

In digital communication, in order to extend the communication duration allowed for a portable terminal such as a cellular phone, a high-efficiency linear amplifier is required. One example of such a linear amplifier is an amplifier semiconductor device.

The quality of communication depends on an adjacent channel leakage power. When the adjacent channel leakage power of an amplifier semiconductor device exceeds a specified value, the amplifier semiconductor device cannot be utilized for communication even if the efficiency thereof is high.

FIG. 19 is a graph for explaining the physical effect of the adjacent channel leakage power. The adjacent channel leakage power is a parameter for evaluating the leakage of a modulated wave signal beyond its band when the signal is amplified. When the adjacent channel leakage power exceeds a specified value, it blocks the communication at an adjacent channel. In order to realize high-quality communication without the blocking of the communication at an adjacent channel, the adjacent channel leakage power needs to be below the specified value.

Conventionally, a high electron mobility transistor (HEMT) and a metal semiconductor field effect transistor (MESFET) suitable for radio-frequency (RF) operation are used for the amplifier semiconductor device.

With the increasing demand for smaller and lighter portable terminals, smaller batteries have been developed to meet the demand for such portable terminals. To meet the demand for smaller batteries, the operating voltage (drain voltage) of the amplifier semiconductor device needs to be made low.

In order to enhance the performance of an amplifier semiconductor element used for the amplifier semiconductor device, the amount of parasitic components of the amplifier semiconductor element which may degrade the electric characteristics thereof must be decreased.

In the amplifier semiconductor element, an n-layer (hereinbelow, also referred to as an "operation layer") is made shallow to suppress a short channel effect which may affect the withstand voltage characteristics and in consideration of the current shut-off characteristics of the operation layer by use of a gate bias. On the other hand, no established technique for forming a shallow n$^+$-layer exists at present because doping becomes less controllable as the doping is nearer to the surface. For these reasons, in the amplifier semiconductor element, the n-layer is generally made shallower than the n$^+$-layer.

In order to apply a field effect transistor (FET) to a high-output amplifier semiconductor element, the withstand voltage between a gate electrode and a drain electrode must be high. The withstand voltage can be made high by securing a sufficiently large distance between the gate electrode and the drain electrode. However, if the distance between the gate electrode and the drain electrode is excessively large, a parasitic resistance increases, thereby degrading the electric characteristics. A method for increasing the withstand voltage between the gate electrode and the drain electrode without providing a large distance between the gate electrode and the drain electrode is described in Japanese Laid-Open Publication No. 3-233942. According to this method, a step is formed in an operation layer, and a source electrode and a gate electrode are formed on an upper portion of the operation layer with respect to the step, while a drain electrode is formed on a lower portion thereof. A method where a portion of an operation layer located between a gate electrode and a drain electrode is provided with a high resistance is also known.

The conventional amplifier semiconductor element has disadvantages as follows. As the operating voltage (drain voltage) of the amplifier semiconductor element becomes low due to a reduced power supply voltage, the absolute of a threshold voltage or a pinch-off voltage reduces. For example, according to "WNx/W self-aligned gate GaAs MESFET for 1.9 GHz band power amplification operable at low voltage and single power supply", 1993 Electronic Information Communication Society Autumn Convention C-376, the threshold voltage is >−1 V (i.e., the absolute is less than 1 V) for the operating voltage of 2.7 V.

The "pinch-off voltage" means a gate bias $V_g$ applied when a minute source-drain current flows. The value of the pinch-off voltage is substantially the same as the value of threshold voltage $V_{th}$ depending on the setting of the source-drain current. Under ion implantation conditions causing a large leakage current, the shut-off of the source-drain current is not possible even if a gate voltage is applied. Under such conditions, therefore, an appropriate value for the pinch-off voltage cannot be obtained.

In order to provide a low-cost amplifier semiconductor element, using an ion implantation process is more desirable than using an expensive epitaxial wafer. Using the ion implantation process, however, makes it difficult to obtain a high-efficiency amplifier semiconductor element. For example, as reported in the above-mentioned "WNx/W self-aligned gate GaAs MESFET for 1.9 GHz band power amplification operable at low voltage and single power supply", 1993 Electronic Information Communication Society Autumn Convention C-376, it is extremely difficult to obtain a high-efficiency amplifier semiconductor element with an efficiency of more than 30% for the drain voltage of 1 V or more than 50% for the drain voltage of 3 V.

In order to meet the reduction of the power source voltage, various attempts have been made to improve the low-voltage operation of an amplifier semiconductor element. The operation conditions for an amplifier semiconductor element which requires linear operation are determined one-sidedly based on the specified value of the adjacent channel leakage power. This causes a problem in that increasing only the efficiency of a FET does not contribute to reducing the adjacent channel leakage power below the specified value.

The adjacent channel leakage power is considered to be generated when an amplified signal is distorted beyond a linear region. No device parameter having a direct relationship with the magnitude of the adjacent channel leakage power has been specified at present.

For example, IEICE Trans. Electron., Vol. E78C, No. 9, pp. 1241–1245, September 1995 describes that the flatter the dependency of the transconductance gm on the gate bias $V_g$ is, the better the linearity is. However, the transconductance gm of an actual amplifier semiconductor element at an operation point is not necessarily flat. It is therefore unknown whether or not the linearity actually becomes better as the dependency of the transconductance gm on the gate bias $V_g$ is flatter.

Forming a step in the operation layer of the FET for higher withstand voltage of the amplifier semiconductor element as described above makes the fabrication process of the amplifier semiconductor element complicated. Also, providing a high-resistance portion in the operation layer of the FET as described above causes a problem in the stability at the fabrication of the amplifier semiconductor element.

SUMMARY OF THE INVENTION

The amplifier semiconductor element of this invention includes a field effect transistor of which a threshold voltage $V_{th}$ has a predetermined relationship with an operating voltage.

In one embodiment of the invention, the operating voltage is a drain voltage $V_{dr}$, and the predetermined relationship includes a relationship of $V_{dr} \leq |V_{th}|$.

In another embodiment of the invention, the drain voltage $V_{dr}$ is in the range of 1.0 V to 3.5 V, and the threshold voltage $V_{th}$ is in the range of –2.5 V to –4.5 V.

In still another embodiment of the invention, the predetermined relationship further includes a relationship of $V_{dr} \leq 4|V_{th}|-9$.

In still another embodiment of the invention, the amplifier semiconductor element includes: a substrate; an n-layer formed in a surface portion of the substrate; and n⁻-layers formed on both sides of the n-layer, wherein a depth of the n-layer from the surface of the substrate is larger than a depth of the n⁺-layers from the surface of the substrate.

In still another embodiment of the invention, the n-layer extends underneath the n⁺-layers.

In still another embodiment of the invention, the amplifier semiconductor element includes: a substrate; an n-layer formed in a surface portion of the substrate; and n⁺-layers formed on both sides of the n-layer, wherein an ion implantation profile peak position of the n-layer is deeper than an ion implantation profile peak position of the n⁺-layers.

In still another embodiment of the invention, the ion implantation profile peak position of the n-layer is deeper than the ion implantation profile peak position of the n⁺-layers by 0.04 μm to 0.10 μm.

According to another aspect of the invention, a method for fabricating an amplifier semiconductor element is provided. The method includes a first step of controlling a threshold voltage $V_{th}$ so that the threshold voltage $V_{th}$ has a predetermined relationship with an operating voltage.

In one embodiment of the invention, the amplifier semiconductor element includes: a substrate; an n-layer formed in a surface portion of the substrate; and n⁺-layers formed on both sides of the n-layer, and the first step includes a second step of forming the n-layer by implanting ions in the substrate under a first predetermined condition.

In another embodiment of the invention, the first predetermined condition includes a condition of implanting ions at a dose amount of $2.7 \times 10^{12}$ to $4.0 \times 10^{12}$.

In still another embodiment of the invention, the first step further includes a third step of implanting ions under a second predetermined condition to form the n⁺-layers, the first predetermined condition includes a condition of implanting ions at an acceleration energy in the range of 100 keV to 150 keV, and the second predetermined condition includes a condition of implanting ions at an acceleration energy in the range of 50 keV to 80 keV.

According to still another aspect of the invention, an amplifier semiconductor device is provided. The device includes: a plurality of amplifier semiconductor elements according to claim 1, each of the amplifier semiconductor elements having a gate, a source, and a drain; and a matching circuit connected with the gate of the amplifier semiconductor element.

Thus, the invention described herein makes possible the advantages of (1) providing an amplifier semiconductor element which can operate at high efficiency while suppressing the adjacent channel leakage power below a specified value, a method for fabricating such an amplifier semiconductor element at low cost, and an amplifier semiconductor device using such an amplifier semiconductor element, and (2) providing an amplifier semiconductor element having high withstand voltage, a method for fabricating such an amplifier semiconductor element, and an amplifier semiconductor device using such an amplifier semiconductor element.

These and other advantages of the present invention will become apparent to those skilled in the art upon reading and understanding the following detailed description with reference to the accompanying figures.

BRIEF DESCRIPTION OF THE DRAWINGS

FIG. 1 is a sectional view of an amplifier semiconductor element according to the present invention.

FIGS. 4A to 4J are sectional views illustrating the steps for fabricating the amplifier semiconductor element of FIG. 1, wherein FIG. 4A shows the step of forming an n-layer, FIG. 4B shows the step of forming n⁺-layers, FIG. 4C shows the step of forming an SiN layer, FIG. 4D shows the step of forming a resist pattern, FIG. 4E shows the step of forming multilayer electrodes, FIG. 4F shows the step of forming a gate electrode, FIG. 4G shows the step of forming another SiN layer, FIG. 4H shows the step of forming a contact hole resist pattern, FIG. 4I shows the step of forming a power supply resist pattern, and FIG. 4J shows the step of forming power supply electrodes.

FIG. 14 is a Lindhard Scharff and Schiott (LSS) distribution diagram observed when the acceleration energy at the n-layer ion implantation is 80 keV.

DESCRIPTION OF THE PREFERRED EMBODIMENTS

Figure 2A:
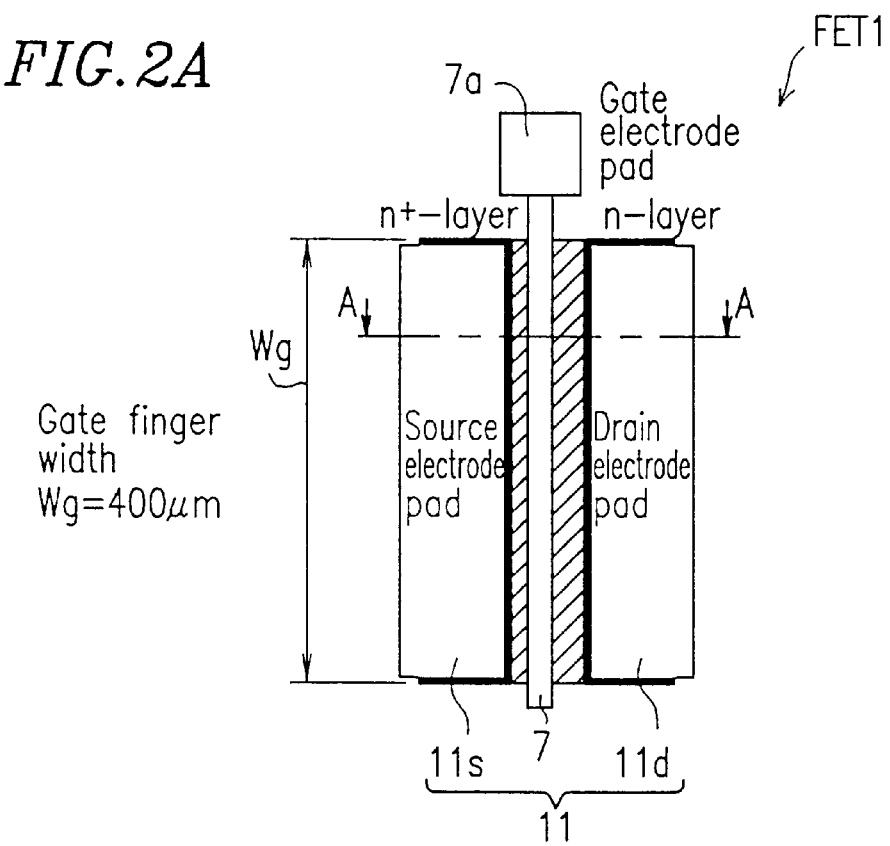
FIG. 2A is a plan view of the amplifier semiconductor element of FIG. 1.

The present invention will be described by way of example with reference to the accompanying drawings.

FIG. 1 shows a configuration of an amplifier semiconductor element FET1 according to the present invention. The amplifier semiconductor element FET1 includes a semi-insulating GaAs substrate 20. An n-layer 1 is formed in a surface portion of the semi-insulating GaAs substrate 20, and n$^+$-layers 2 are formed on both sides of the n-layer 1. A gate electrode 7 is formed on the n-layer 1, and multilayer electrodes 5 are formed on the n$^+$-layers 2 so as to sandwich the gate electrode 7. The multilayer electrodes 5 are composed of Au/Ni/Au—Ge layers. A power supply electrode 11 including a source electrode pad 11s and a drain electrode pad 11d is formed on the multilayer electrodes 5. SiN layers 3 are formed as insulating films on the semi-insulating GaAs substrate 20 located on the outer sides of the n$^+$-layers 2. Additional SiN layers 8 are formed on the SiN layers 3 as insulating films.

A depth hn of the n-layer 1 from the surface of the semi-insulating GaAs substrate 20 is larger than a depth hn$^+$ of the n$^+$-layers 2 from the surface of the semi-insulating GaAs substrate 20. The n-layer 1 extends underneath the n$^+$-layers 2.

FIG. 2A is a plan view of the amplifier semiconductor element FET1. In FIG. 2A, the same components as those shown in FIG. 1 are denoted by the same reference numerals, and the description thereof is omitted here. The amplifier semiconductor element FET1 further includes a gate electrode pad 7a. The gate electrode 7 has a gate finger width $W_g$, which will be described later.

Figure 2B:
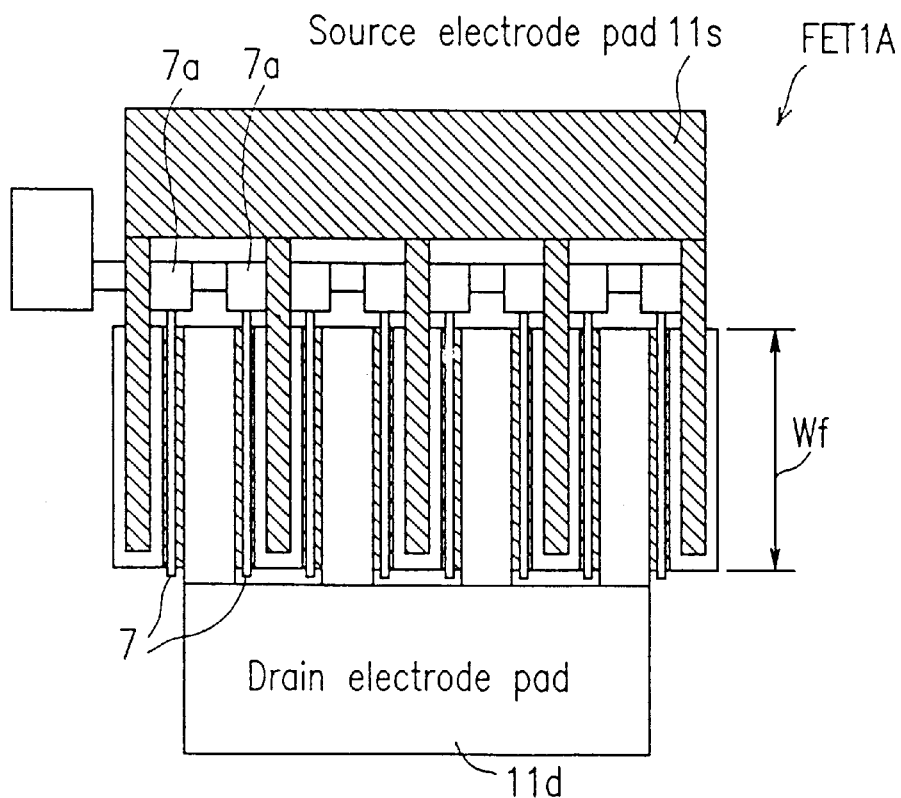
FIG. 2B is a plan view of an alternative amplifier semiconductor element according to the present invention.

FIG. 2B is a plan view of an alternative amplifier semiconductor element FET1A according to the present invention. The amplifier semiconductor element FET1A includes a multi-finger type gate electrode 7 having a gate finger width $W_g$, which also will be described later.

Figure 3:
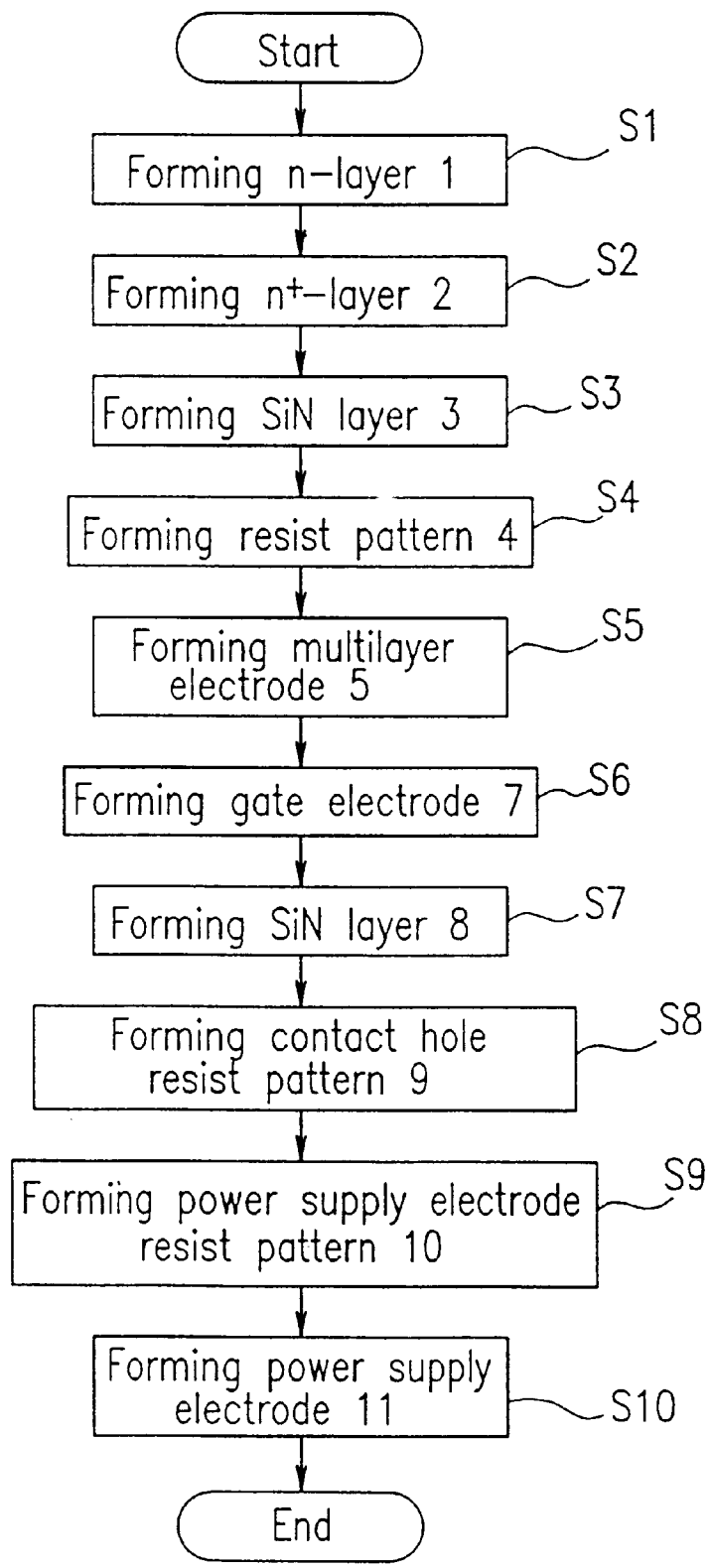
FIG. 3 is a flowchart showing a method for fabricating the amplifier semiconductor element of FIG. 1.

FIG. 3 is a flowchart showing a fabrication method of the amplifier semiconductor element FET1, and FIGS. 4A to 4J are sectional views illustrating the steps of the fabrication method of the amplifier semiconductor element FET1.

Figure 4A:
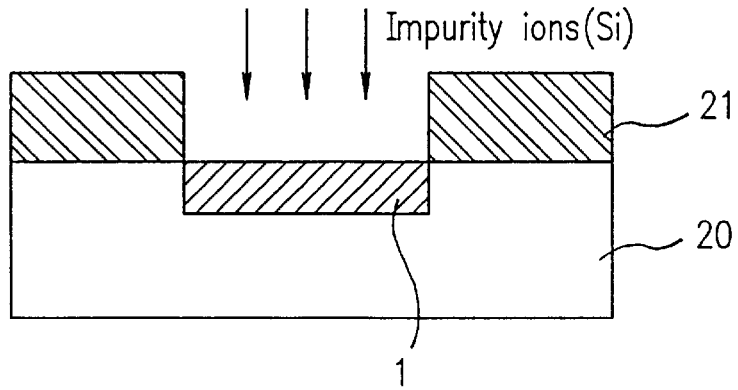

At step S1, as shown in FIG. 4A, a resist pattern 21 is formed on the semi-insulating GaAs substrate 20. Using the resist pattern 21, Si ions are implanted at an acceleration voltage of 100 KeV and an ion dose amount of $2.7 \times 10^{12}$ cm$^{-2}$ to $4.0 \times 10^{12}$ cm$^{-2}$, to form the n-layer 1.

Figure 4B:
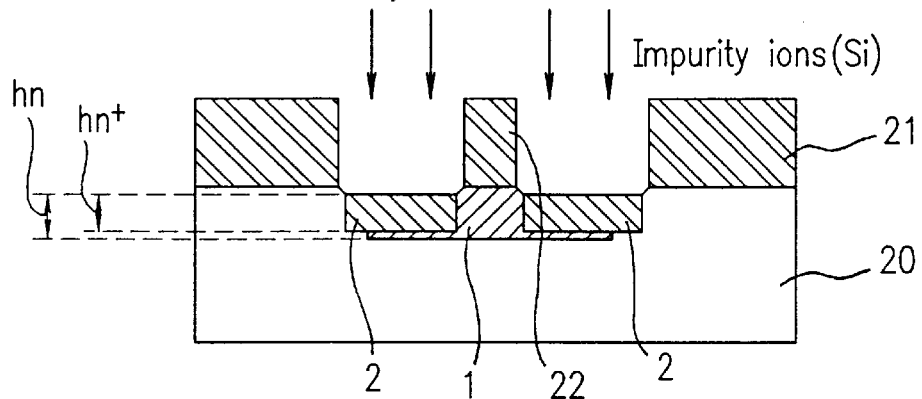

At step S2, as shown in FIG. 4B, a resist pattern 22 is formed on the center portion of the n-layer 1. Using the resist patterns 21 and 22, Si ions are implanted at two stages, i.e., at an acceleration voltage of 50 KeV and a dose amount of $2 \times 10^{13}$ cm$^{-2}$ for the first stage, and at an acceleration voltage of 80 KeV and a dose amount of $3 \times 10^{13}$ cm$^{-2}$ for the second stage, to form the n$^+$-layers on the both sides of the n-layer 1. Since the acceleration voltage for the n-layer 1, i.e., 100 KeV, is larger than the acceleration voltages for the n$^+$-layers 2, i.e., 50 KeV and 80 KeV, the depth hn of the n-layer 1 from the surface of the GaAs substrate 20 is larger than the depth hn$^+$ of the n$^+$-layers 2 from the surface of the GaAs substrate 20. Thus, the bottom portion of the n-layer 1 is left under the n$^+$-layers 2, forming extended portions of the n-layer 1.

Figure 4C:
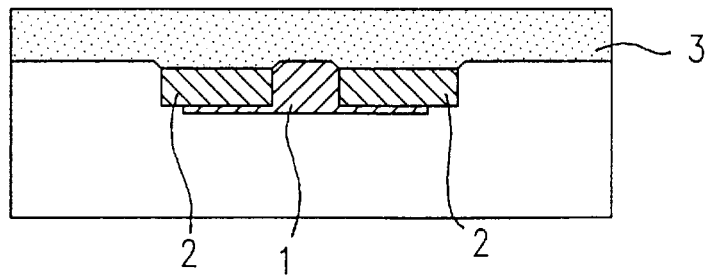

At step S3, as shown in FIG. 4C, after an annealing process for activating the resultant surface, the SiN layer 3 is formed by chemical vapor deposition (CVD). In this example, the thickness of the SiN layer 3 is 300 nm.

Figure 4D:
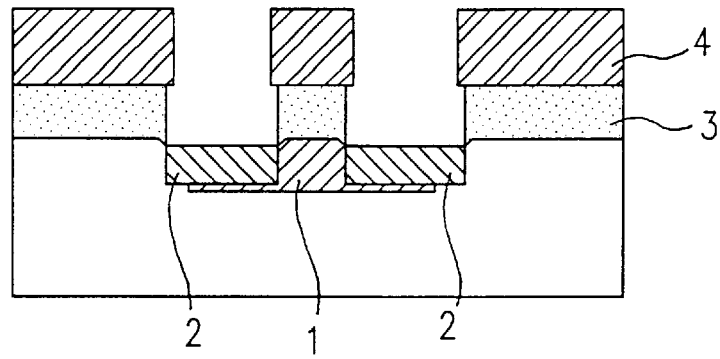

At step S4, as shown in FIG. 4D, An ohmic electrode resist pattern 4 is formed by photolithography. The exposed portions of the SiN layer 3 are etched with a 5% hydrofluoric acid (HF) solution to expose the underlying GaAs surface.

Figure 4E:
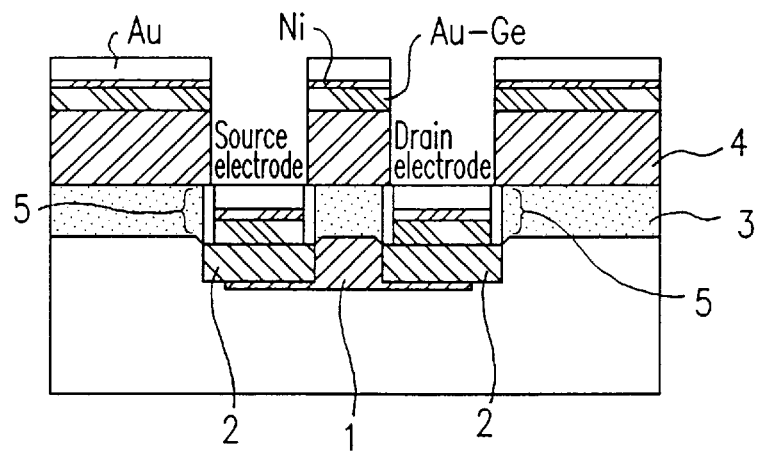

At step S5, as shown in FIG. 4E, Au—Ge, Ni, and Au are deposited in this order to thicknesses of 100 nm, 20 nm, and 100 nm, respectively, to form the Au/Ni/Au—Ge multilayer electrodes 5. The ohmic contact is attained by a two-minute alloy treatment at 400° C., forming a source electrode and a drain electrode.

Figure 4F:
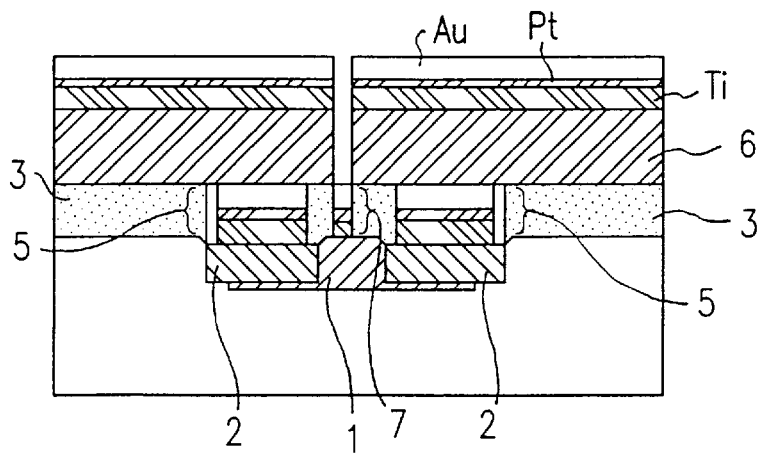

At step S6, as shown in FIG. 4F, after removing the ohmic electrode resist pattern 4 and the Au/Ni/Au—Ge layers deposited thereon, a gate electrode resist pattern 6 is formed by photolithography. The exposed portion of the SiN layer 3 is etched with a 5% HF solution to expose the underlying GaAs surface. Then, Ti, Pt, and Au are deposited in this order to thicknesses of 100 nm, 100 nm, and 100 nm, respectively, to form the Au/Pt/Ti gate electrode 7 by a lift-off method.

Figure 4G:
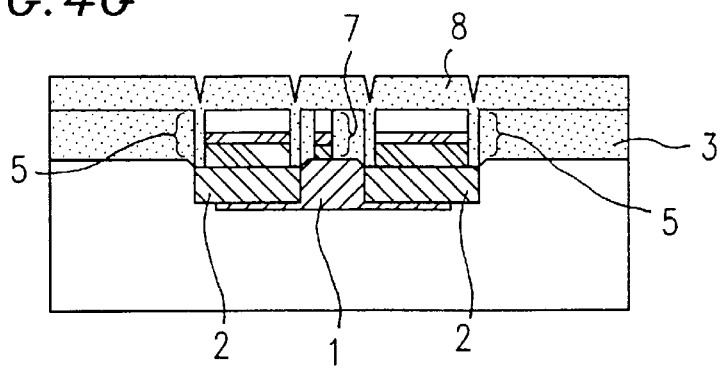

At step S7, as shown in FIG. 4G, the SiN layer 8 of a thickness of 200 nm is formed by a p-CVD method.

Figure 4H:
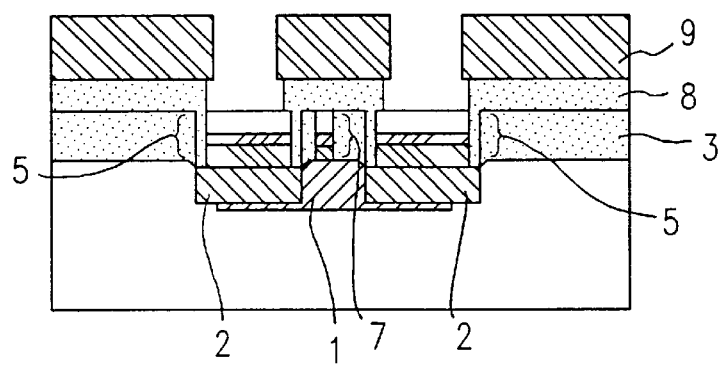

At step S8, as shown in FIG. 4H, a contact hole resist pattern 9 is formed by photolithography. The exposed portions of the SiN layer 8 are etched with a 5% HF solution to expose the surface of the Au/Ni/Au—Ge multilayer electrodes 5 and the power supply point (not shown) of the gate electrode 7.

Figure 4I:
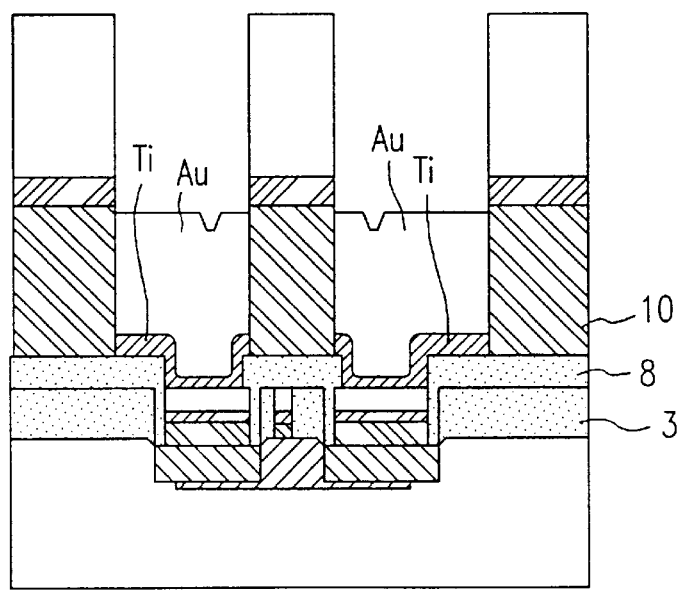

At step S9, as shown in FIG. 4I, the resist pattern 9 is removed, and a power supply electrode resist pattern 10 is formed by photolithography. Thereafter, Ti and Au are deposited in this order to thicknesses of 100 nm and 1000 nm, respectively.

Figure 4J:
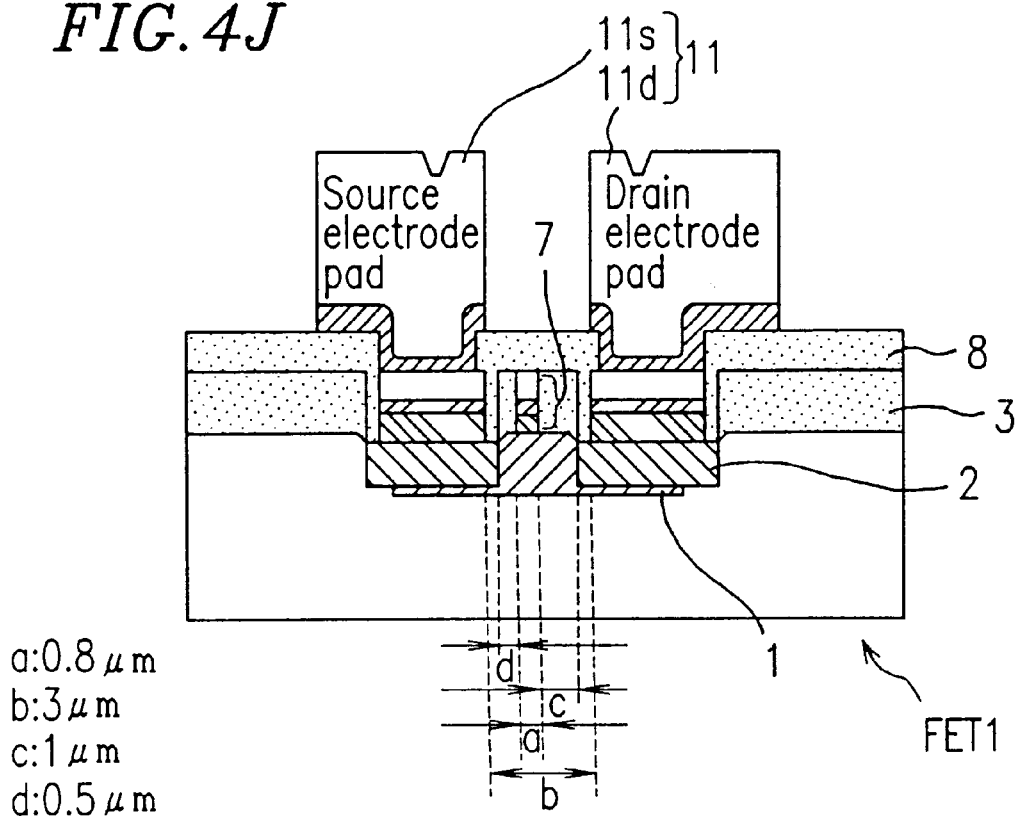

At step S10, as shown in FIG. 4J, the power supply electrode 11 which includes the source electrode pad 11s and the drain electrode pad 11d is formed by the lift-off method.

The thus-fabricated amplifier semiconductor element FET1 has the following dimensions as shown in FIGS. 1 and 4J.

Gate length a: 0.8 $\mu$m

Gate width: 4 mm

Distance between source and drain electrodes b: 3 $\mu$m

Figure 5:
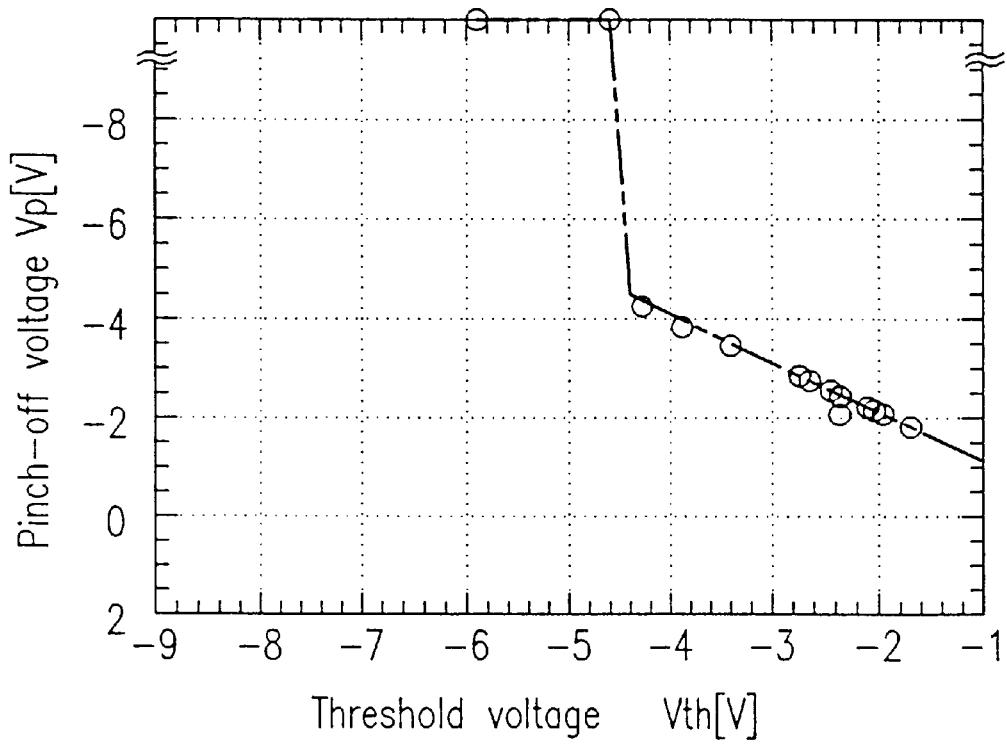
FIG. 5 is a graph showing the relationship between the pinch-off voltage $V_P$ and the threshold voltage $V_{th}$ of the amplifier semiconductor element of FIG. 1.

Distance between edge of source-side n$^+$-layer and end of gate electrode d: 0.5 $\mu$m Distance between end of gate electrode and edge of drain-side n$^+$-layer c: 1 $\mu$m FIG. 5 shows the relationship between the pinch-off voltage $V_P$ and the threshold voltage $V_{th}$ of the amplifier semiconductor element FET1. The pinch-off voltage $V_P$ as used herein denotes a gate bias $V_g$ when it can control the source-drain current to become a minute current of 50 $\mu$A per 1 mm of the gate width $W_g$. As is observed from FIG. 5, when the threshold voltage $V_{th}$ is in the range of $-4.5$ V to $-1$ V, the pinch-off voltage V. is substantially the same as the threshold voltage $V_{th}$. When the threshold voltage $V_{th}$ is below $-4.5$ V, the shutoff of the source-drain current is not possible. In such a case, an appropriate value for the pinch-off voltage is not obtained.

Accordingly, when the threshold voltage $V_{th}$ is below $-4.5$ V, the control of the source-drain current using the gate voltage is not possible. Therefore, in order to ensure that the source-drain current can be controlled using the gate voltage in the amplifier semiconductor element FET1, the threshold voltage $V_{th}$ needs to be set at a more positive value above $-4.5$ V.

The gate width $W_g$ is calculated by expression (1) below with the gate finger width $W_f$ and the number of fingers nf mentioned with reference to FIGS. 2A and 2B.

$$W_g = W_f \times nf \quad (1)$$

For example, assuming that the number of fingers nf is 10 and the gate finger width $W_f$ is 400 $\mu$m in a multi-finger type gate as shown in FIG. 2B, the gate width $W_g$ is calculated by expression (2) below.

$$W_g = 400\ \mu m \times 10\ \text{fingers} = 4\ \text{mm} \quad (2)$$

Figure 6:
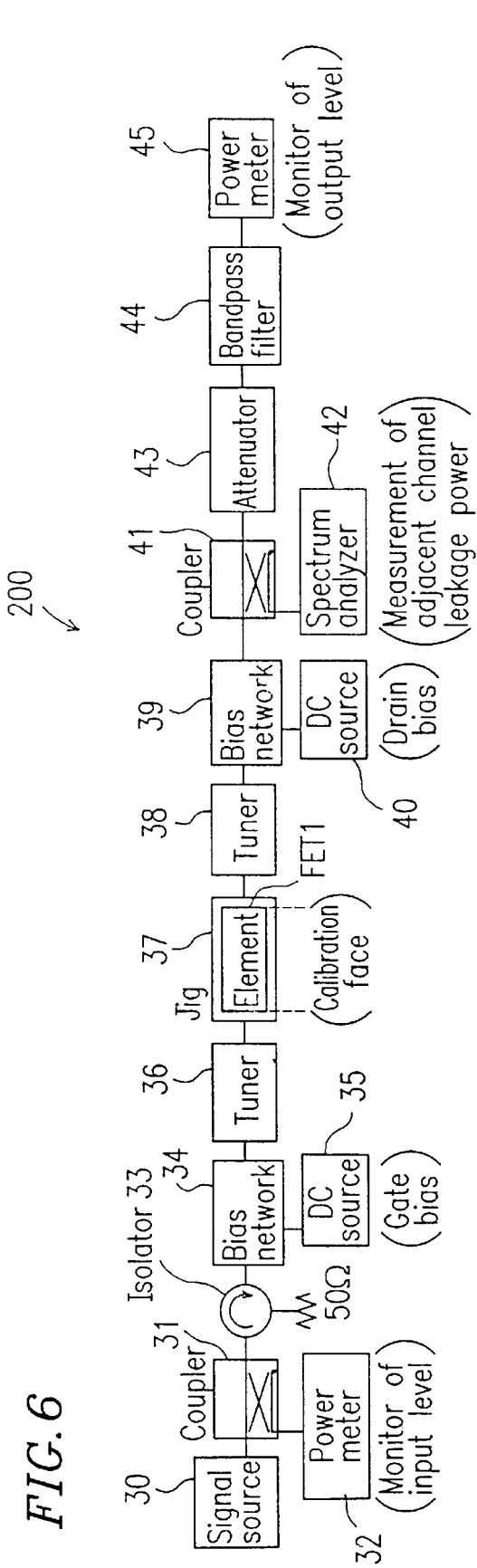
FIG. 6 is a block diagram of a radio-frequency measurement apparatus for measuring radio-frequency characteristics of the amplifier semiconductor element of FIG. 1.

FIG. 6 shows a configuration of a radio-frequency (RF) measurement apparatus 200 for measuring the RF characteristics of the amplifier semiconductor element FET1. The RF measurement apparatus 200 includes a signal source 30, a coupler (directional coupler) 31, a power meter 32, an isolator 33, a bias network 34, a DC source 35 for gate bias application, an input-side tuner 36, a jig 37, an output-side tuner 38, a bias network 39, a DC source 40 for drain bias application, a coupler 41, a spectrum analyzer 42, an attenuator 43, a bandpass filter 44, and a power meter 45. The RF measurement apparatus 200 measures the RF characteristics of the amplifier semiconductor element FET1 which is held by the jig 37 in the following manner.

Part of a RF signal generated by the signal source 30 is sampled out by the coupler 31, and the sampled RF signal is supplied to the power meter 32. The power meter 32 monitors the input level of the RF signal. The remaining of the RF signal which has passed through the coupler 31 is supplied to the isolator 33. The isolator 33 serves to prevent a reflected signal which may be generated from the downstream measurement circuits from affecting the intended measurement. The RF signal which has passed through the isolator 33 is then supplied to the bias network 34. The bias network 34 includes a capacitor for cutting a DC component and an inductor for cutting RF. The bias network 34 prevents a DC bias from the DC source 35 for gate bias application from entering the measurement system located opposite to the bias network 34 with respect to the amplifier semiconductor element FET1 (the jig 37), as well as preventing the DC source 35 for gate bias application from affecting the RF signal.

The RF signal which has passed through the bias network 34 is supplied to the input-side tuner 36. The input-side tuner 36 changes the input impedance. Likewise, the output-side tuner 38 changes the output impedance. More specifically, the input-side tuner 36 and the output-side tuner 38 change the respective impedances to increase the gain, the output, the efficiency, and the like. The input-side tuner 36 and the output-side tuner 38 optimize the signal wave impedance and the load impedance so that the intermodulation distortion (IMD), the adjacent channel leakage power (ACP), and the like are minimized. The bias network 39 and the DC source 40 for drain bias application have functions similar to those of the bias network 34 and the DC source 35 for gate bias application.

Part of the signal which has passed through the bias network 39 is sampled out by the coupler 41 and supplied to the spectrum analyzer 42. The spectrum analyzer 42 measures the adjacent channel leakage power and the intermodulation distortion. The remaining of the signal which has passed through the coupler 41 is supplied to the power meter 45 via the attenuator 43 and the bandpass filter 44. The attenuator 43 is provided to protect the power meter 45 against large power to be generated after amplification. The bandpass filter 44 samples out only a signal in an intended frequency band for detection. The power meter 45 monitors the output level of the signal. In the RF measurement apparatus 200 shown in FIG. 6, the calibration faces are the end faces of the amplifier semiconductor element FET1.

The measurement conditions for the RF measurement apparatus 200 are as follows.

Frequency: 1900 MHz $\pi/4$DQPSK modulation (bit rate: 384 Kbps, modulation pattern: PN9, roll-off factor of route Nyquist filter: 0.5)

Output level: 22 dBm

Figure 7:
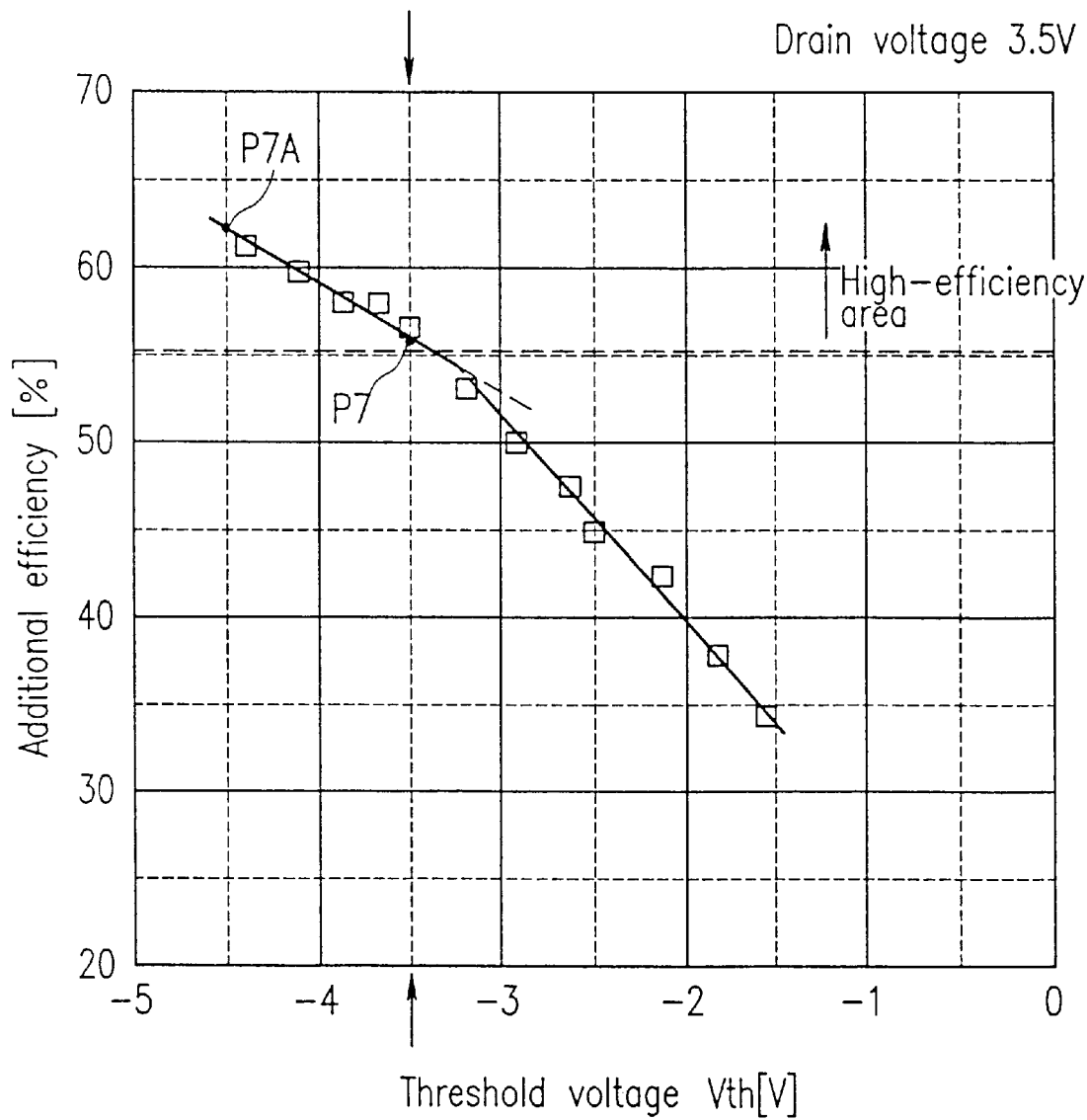
FIG. 7 is a graph showing the experimental results of the relationship between the threshold voltage $V_{th}$ and the additional efficiency of the amplifier semiconductor element of FIG. 1 when the drain voltage is 3.5 V.

FIG. 7 shows the experiment results of the relationship between the threshold voltage $V_{th}$ and the additional efficiency of the amplifier semiconductor element FET1 when the drain voltage is 3.5 V under the condition that the adjacent channel leakage power is below a specified value. It is observed from this graph that, in the case of the drain voltage of 3.5 V, a high additional efficiency of 55% or more is obtained when the threshold voltage $V_{th}$ is −3.5 V or less, while satisfying the conditions for the adjacent channel leakage power. The conditions for the adjacent channel leakage power are as follows.

Band width: 192 KHz
Detuning at 600 KHz
Adjacent channel leakage power <−60 dBc

Figure 8:
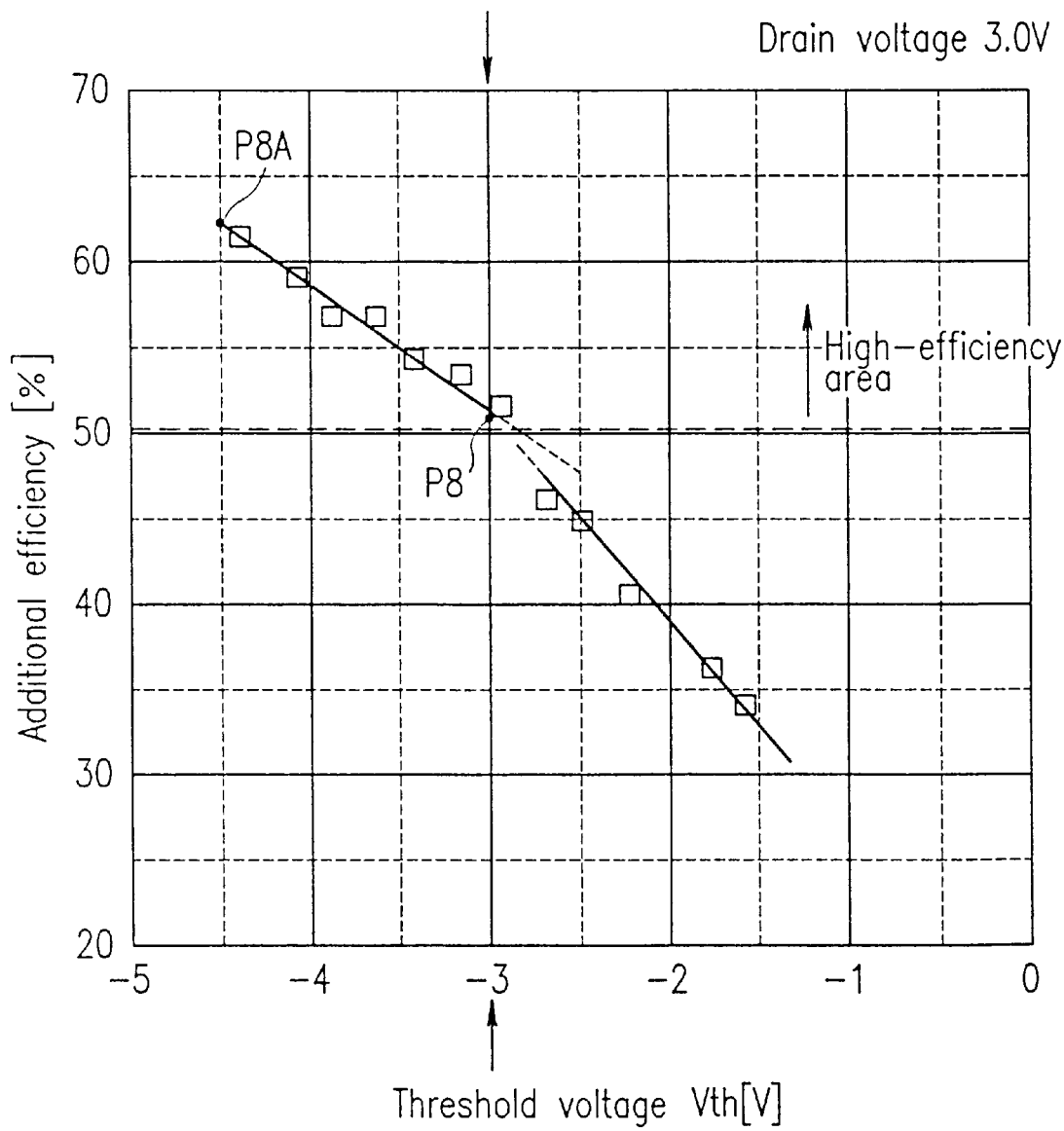
FIG. 8 is a graph showing the experimental results of the relationship between the threshold voltage $V_{th}$ and the additional efficiency of the amplifier semiconductor element of FIG. 1 when the drain voltage is 3.0 V.

FIG. 8 shows the experiment results of the relationship between the threshold voltage $V_{th}$ and the additional efficiency when the drain voltage is 3.0 V. It is observed from this graph that, in the case of the drain voltage of 3.0 V, a high additional efficiency of 50% or more is obtained when the threshold voltage $V_{th}$ is −3.0 V or less, while satisfying the conditions for the adjacent channel leakage power. The conditions for the adjacent channel leakage power are the same as those described above with reference to FIG. 7.

Figure 9:
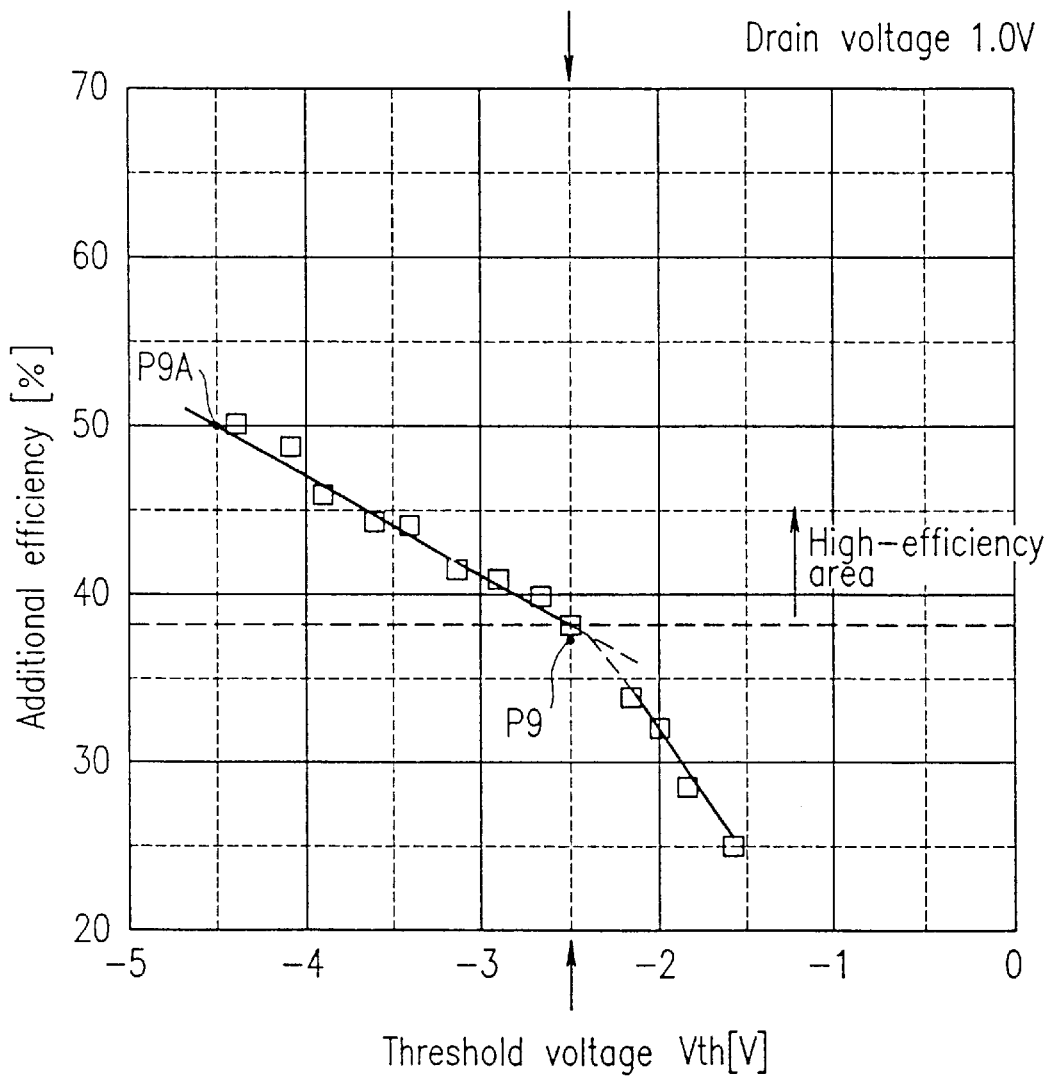
FIG. 9 is a graph showing the experimental results of the relationship between the threshold voltage $V_{th}$ and the additional efficiency of the amplifier semiconductor element of FIG. 1 when the drain voltage is 1.0 V.

FIG. 9 shows the experiment results of the relationship between the threshold voltage $V_{th}$ and the additional efficiency when the drain voltage is 1.0 V. It is observed from this graph that, in the case of the drain voltage of 1.0 V, a high additional efficiency of 39% or more is obtained when the threshold voltage $V_{th}$ is −2.5 V or less, while satisfying the conditions for the adjacent channel leakage power. The conditions for the adjacent channel leakage power are the same as those described above with reference to FIG. 7.

Figure 10:
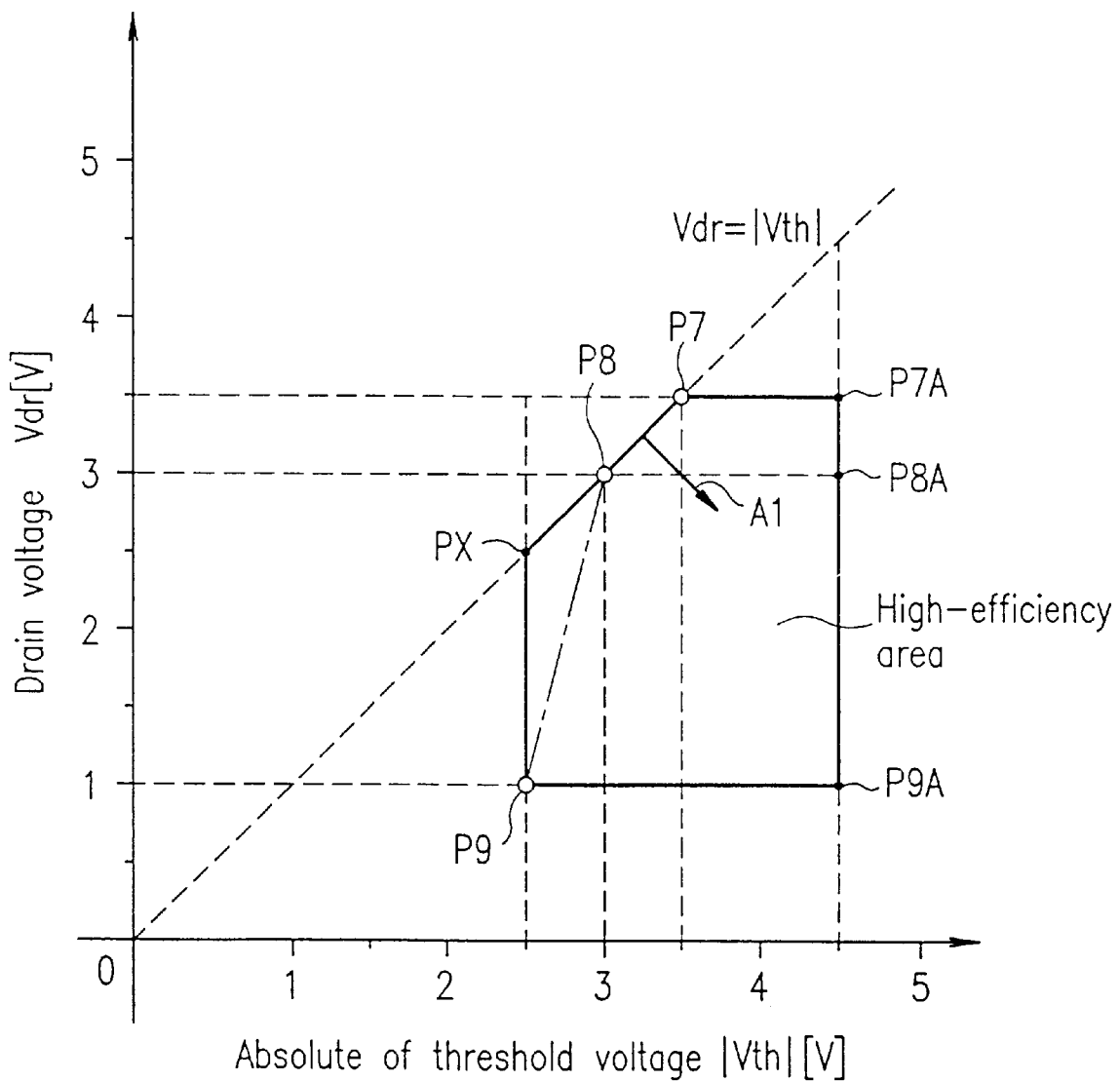
FIG. 10 is a graph showing the relationship between the absolute of the threshold voltage $V_{th}$ and the drain voltage of the amplifier semiconductor element of FIG. 1.

FIG. 10 shows the relationship between the absolute of the threshold voltage $V_{th}$ and the drain voltage of the amplifier semiconductor element FET1. More specifically, this shows the relationship between the threshold voltage $V_{th}$ and the drain voltage $V_{dr}$ for realizing a high-efficiency amplifier semiconductor element FET1 obtained based on the experiment results shown in FIGS. 7 to 9. Points P7 and P7A correspond to points P7 and P7A in FIG. 7. Likewise, points P8 and P8A correspond to points P8 and P8A in FIG. 8, and points P9 and P9A correspond to points P9 and P9A in FIG. 9.

When the points P7 and P8 of the experiment results shown in FIGS. 7 and 8 are taken into consideration, it is understood that, in order to obtain a high-efficiency amplifier semiconductor element FET1 while satisfying the conditions for the adjacent channel leakage power, the absolute of the threshold voltage $|V_{th}|$ and the drain voltage $V_{dr}$ should be somewhere in the area of the graph on the side pointed by arrow A1 with respect to a line connecting the points P7 and P8. In other words, the absolute of the threshold voltage $|V_{th}|$ and the drain voltage $V_{dr}$ should satisfy expression (3) below.

$$V_{dr} \leq |V_{th}| \quad (3)$$

When the points P9, P9A, and P7A of the experiments results shown in FIGS. 7 and 9 are taken into consideration, the drain voltage $V_{dr}$ should be in the range of 1.0 V to 3.5 V, and the threshold voltage $V_{th}$ should be in the range of −2.5 V to −4.5 V.

When the points P8 and P9 of the experiment results shown in FIGS. 8 and 9 are taken into consideration, the absolute of the threshold voltage $|V_{th}|$ and the drain voltage $V_{dr}$ should also satisfy expression (4) below.

$$V_{dr} \leq 4|V_{th}| - 9 \quad (4)$$

Figure 11:
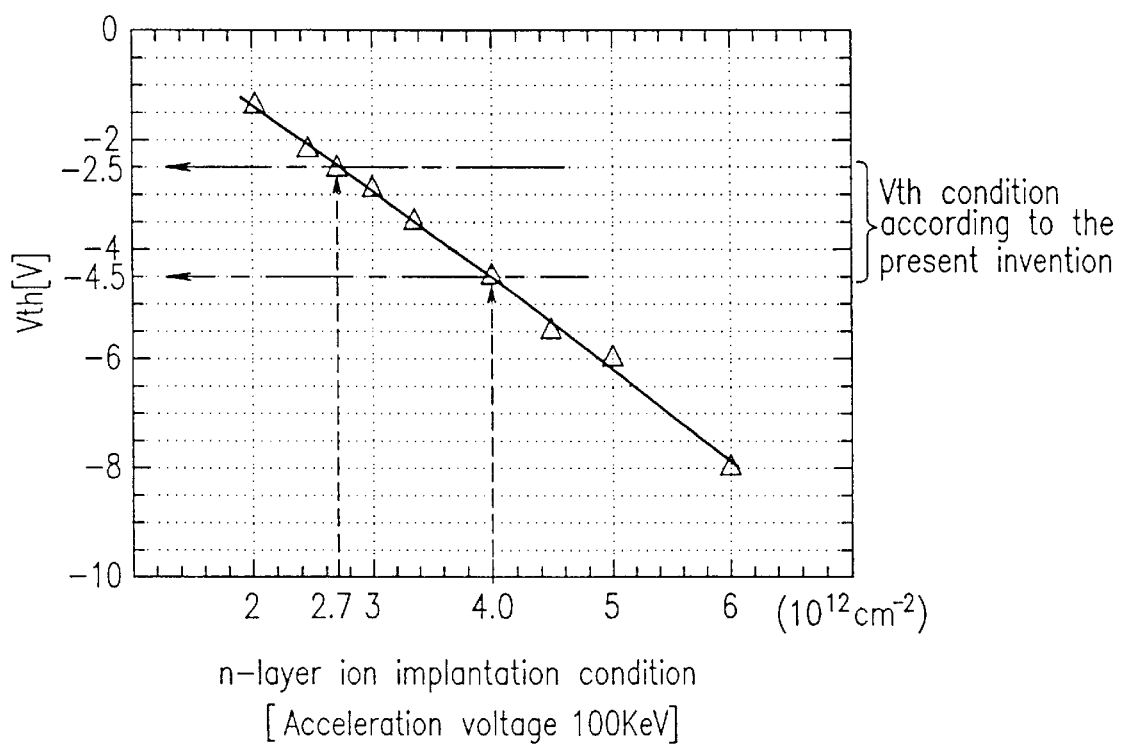
FIG. 11 is a graph showing the relationship between the threshold voltage $V_{th}$ and the n-layer ion implantation condition of the amplifier semiconductor element of FIG. 1.

FIG. 11 shows the relationship between the threshold voltage $V_{th}$ and the n-layer ion implantation condition of the amplifier semiconductor element FET1. When the set dose amount of Si ions into the n-layer 1 is $2.7 \times 10^{12}$ cm$^{-2}$, the threshold voltage $V_{th}$ of the resultant FET is −2.5 V. When the set dose amount of Si ions into the n-layer 1 is $4.0 \times 10^{12}$ cm$^{-2}$, the threshold voltage $V_{th}$ of the resultant FET is −4.5 V. Thus, when Si ions are implanted at a set dose amount in the range of $2.7 \times 10^{12}$ cm$^{-2}$ to $4.0 \times 10^{12}$ cm$^{-2}$ to form the n-layer 1 as described above with reference to FIG. 4A, the amplifier semiconductor element FET1 having a threshold voltage $V_{th}$ of −2.5 V to −4.5 V can be obtained. In other words, the threshold voltage $V_{th}$ can be controlled so as to have a predetermined relationship with the drain voltage $V_{dr}$ by controlling the set dose amount of Si ions for forming n-layer 1.

The relationship between the set dose amount of Si ions into the n-layer 1 and the threshold voltage $V_{th}$ also varies depending on the annealing conditions. Accordingly, the above-described conditions do not restrict the scope of the present invention, but only illustrate an example of the scope to which the present invention is applicable.

Figure 12A:
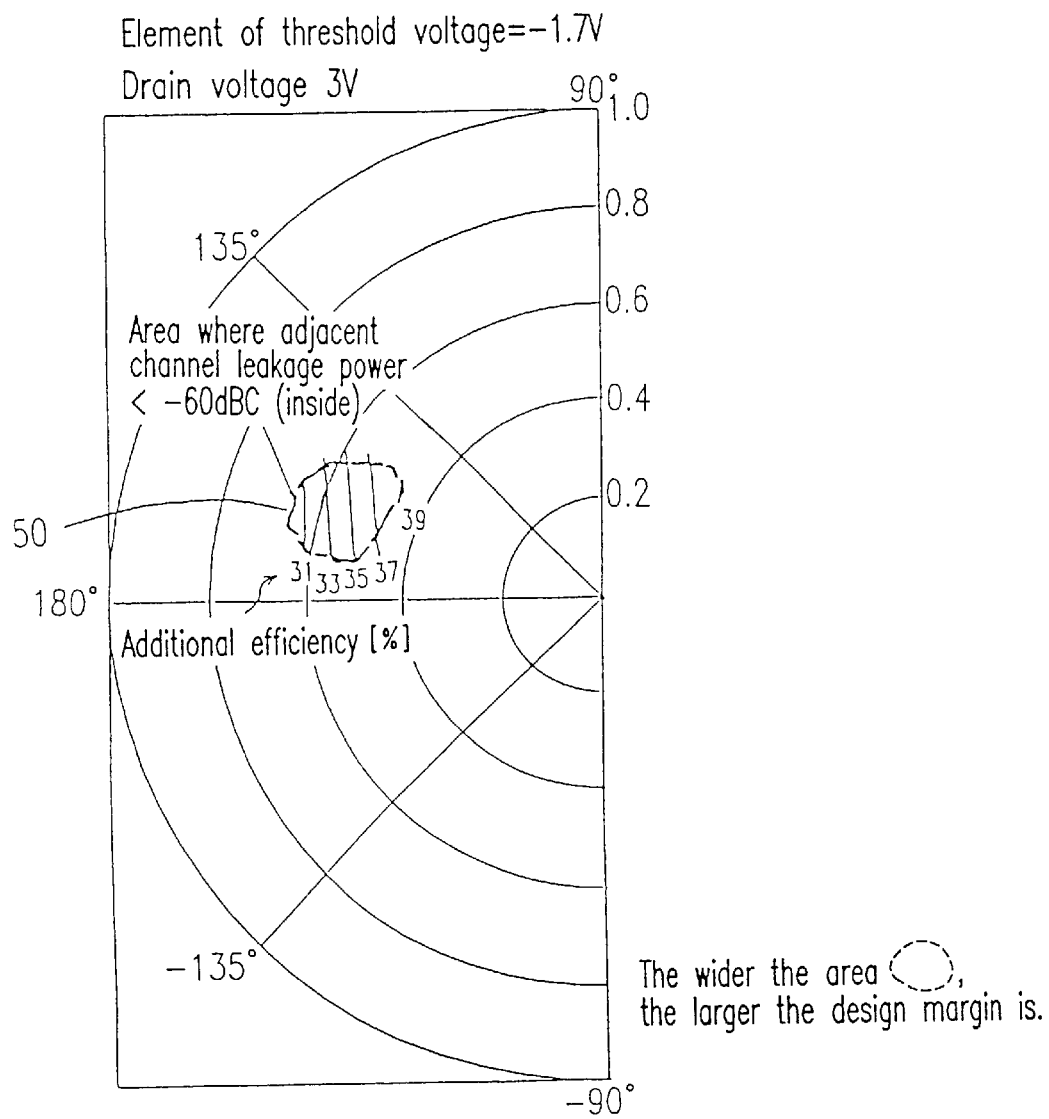
FIGS. 12A and 12B are graphs showing the relationship between the additional efficiency and the impedance of the amplifier semiconductor element of FIG. 1 having a drain voltage of 3V and a threshold voltage $V_{th}$ of $-1.7$ V for FIG. 12A and $-3.7$ V for FIG. 12B when it is found that the conditions for the adjacent channel leakage power have been satisfied from load-pull measurement.
Figure 12B:
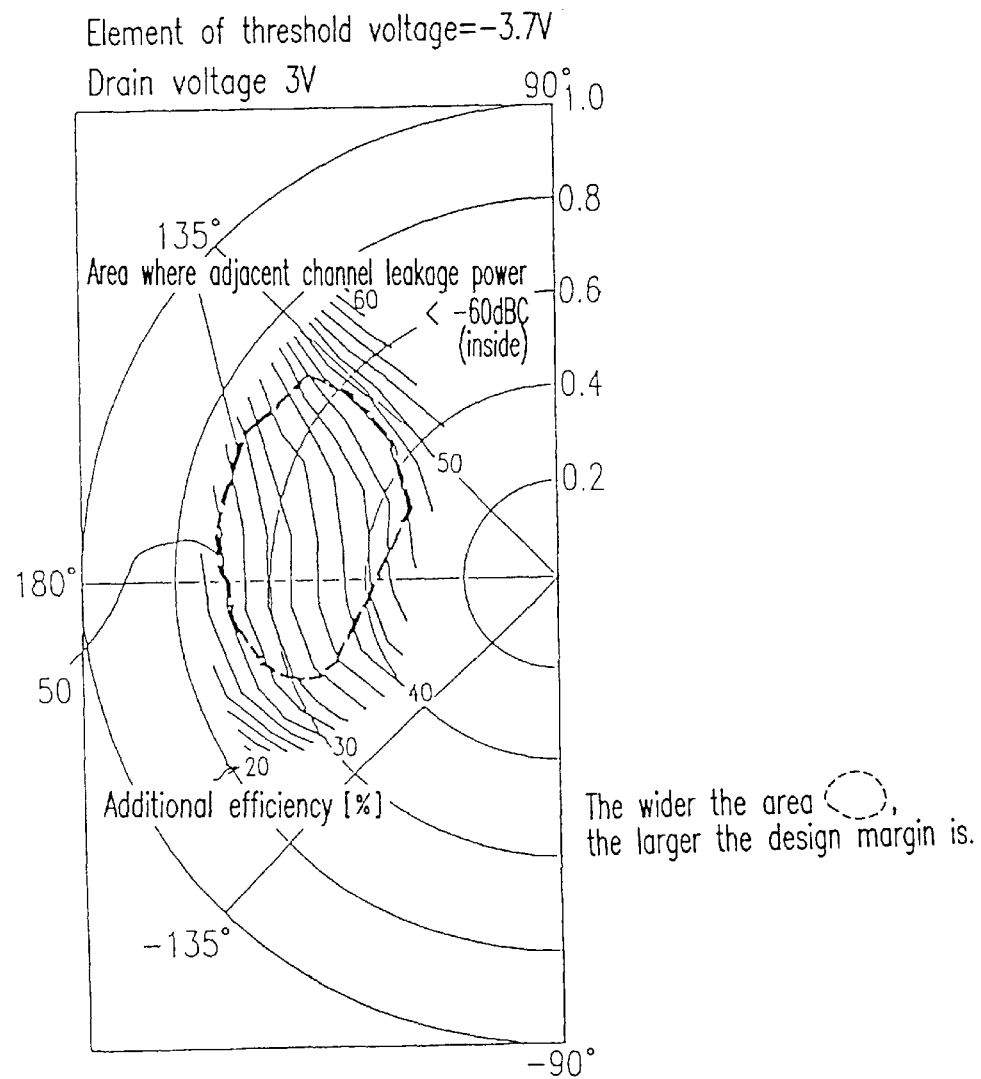

FIGS. 12A and 12B show the relationship between the additional efficiency and the impedance of the amplifier semiconductor element FET1 which operates at the drain voltage of 3V and is found to satisfy the conditions for the adjacent channel leakage power by load-pull measurement. FIG. 12A shows the measurement results of the amplifier semiconductor element FET1 having a threshold voltage $V_{th}$ of −1.7 V, while FIG. 12B shows the measurement results of the amplifier semiconductor element FET1 having a threshold voltage $V_{th}$ of −3.7 V. An area 50 circled by the dotted line in each of FIGS. 12A and 12B represents the area where the adjacent channel leakage power efficiency of the amplifier semiconductor element FET1 is equal to or less than a specified value (−60 dBc or less) in the impedance plane. When an amplifier semiconductor device AP including a matching circuit is to be designed, if circuit conditions are established so that the impedance of the amplifier semiconductor element FET1 is within the circled area 50, the amplifier semiconductor element FET1 operates at an additional efficiency represented by a constant additional efficiency line running inside the circled area 50.

As the absolute of the threshold voltage $V_{th}$ is larger, the circled area 50 becomes wider. As the circled area 50 is wider, the margin of the circuit conditions for the amplifier semiconductor element FET1 increases, allowing for a variation among individual amplifier semiconductor elements FET1. As a result, the freedom of the design of the amplifier semiconductor device AP increases.

On the contrary, if the circled area 50 is small, even if the amplifier semiconductor element FET1 exhibits a high additional efficiency, the impedance of the amplifier semiconductor element FET1 may not be matched with an impedance with a high additional efficiency due to a dispersion among the individual amplifier semiconductor elements FET1, a dispersion in the circuit design, and the like. As a result, the design of a high-efficiency amplifier semiconductor device AP is not possible.

The amplifier semiconductor device AP according to the present invention can also be given a large margin for the design since it constitutes an amplifier having a high-efficiency matching circuit. In other words, even if a dispersion exists among the individual amplifier semiconductor elements FET1, an amplifier semiconductor device AP having a stable additional efficiency can be obtained. The amplifier semiconductor device AP according to the present invention also realizes cost reduction.

Figure 13A:
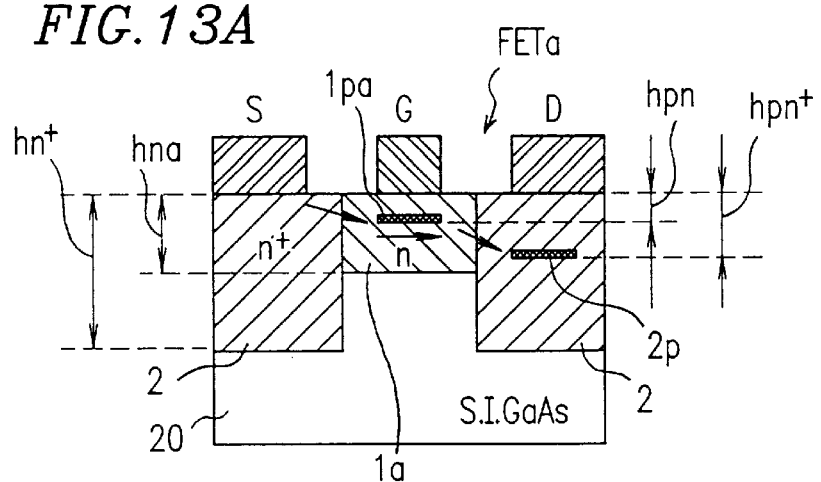
FIG. 13A is a conceptual view for explaining parasitic components of a conventional amplifier semiconductor element FETa.
Figure 13B:
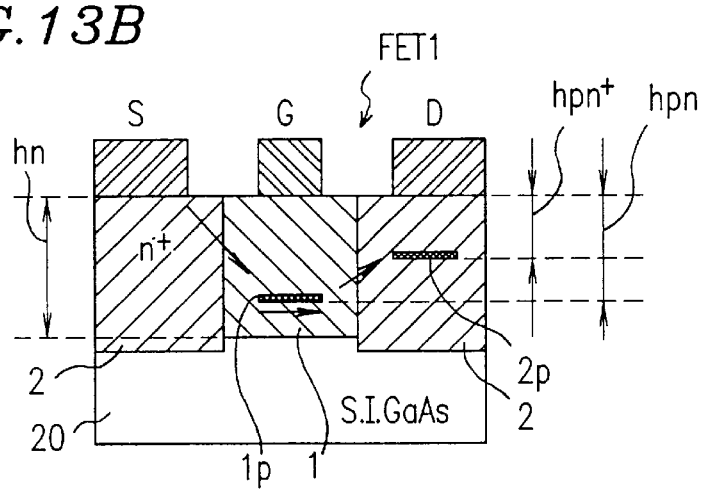
FIGS. 13B and 13C are conceptual views for explaining the effect of decreasing the amount of parasitic components in the amplifier semiconductor element of FIG. 1.
Figure 13C:
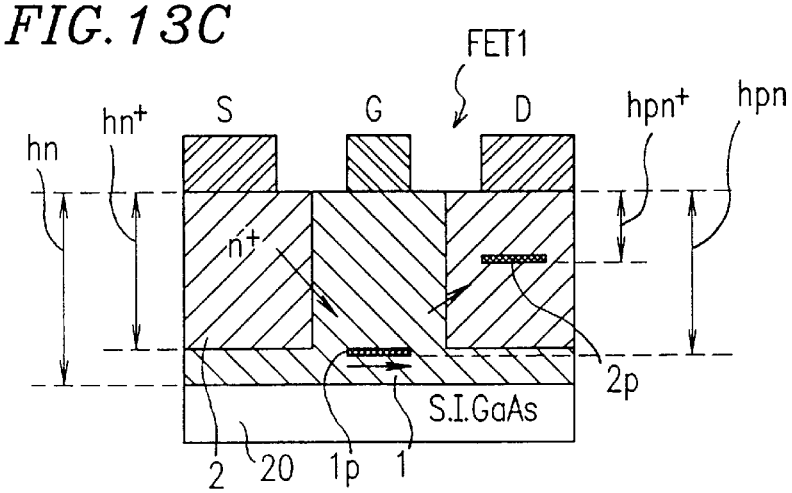

FIG. 13A is a conceptual view for explaining parasitic components of a conventional amplifier semiconductor element FETa. FIGS. 13B and 13C are conceptual views for explaining an effect of decreasing the amount of parasitic components in the amplifier semiconductor element FET1 according to the present invention. As previously described, an n-layer 1a of the amplifier semiconductor element FETa is made shallow, while a technique for forming shallow $n^+$-layers 2 has not yet been established. Accordingly, as shown in FIG. 13A, the n-layer 1a of the amplifier semiconductor element FETa is made shallow compared with the $n^+$-layers 2. In this case, an ion implantation profile peak position 1pa of the n-layer 1a is shallower than an ion implantation profile peak position 2p of the $n^+$-layers 2.

In the amplifier semiconductor element FET1 shown in FIG. 13B, an ion implantation profile peak position 1p of the n-layer 1 is deeper than the ion implantation profile peak position 2p of the $n^+$-layers 2. Accordingly, the n-layer 1 is formed deeper than the n-layer 1a of the amplifier semiconductor element FETa shown in FIG. 13A. This enlarges the contact area between the n-layer 1 and the $n^+$-layers 2. As a result, the amount of parasitic components at the interface between the n-layer 1 and the $n^+$-layers 2 decreases compared with that at the interface between the n-layer 1a and the $n^+$-layers 2 of the amplifier semiconductor element FETa. The decrease in the amount of parasitic components at the interface between the n-layer 1 and the $n^+$-layers 2 improves the RF characteristics of the amplifier semiconductor element FET1.

In the amplifier semiconductor element FET1 shown in FIG. 13C, the ion implantation profile peak position 1p of the n-layer 1 is further deeper than the ion implantation profile peak position 2p of the $n^+$-layers 2. Accordingly, the n-layer 1 is formed deeper than the $n^+$-layers 2, and portions of the n-layer 1 extend underneath the $n^+$-layers 2.

With such extensions of the N-layer 1 formed under the $n^+$-layers 2, the amount of parasitic components at the interface between the n-layer 1 and the $n^+$-layers 2 further decreases compared with that at the interface between the n-layer 1a and the $n^+$-layers 2. The further decrease in the amount of parasitic components further improves the RF characteristics of the amplifier semiconductor element FET1. Moreover, since the depth hn of the n-layer 1 is larger than a depth hna of the n-layer 1a of the amplifier semiconductor element FETa, the gate-drain DC withstand voltage characteristics improve.

Figure 15:
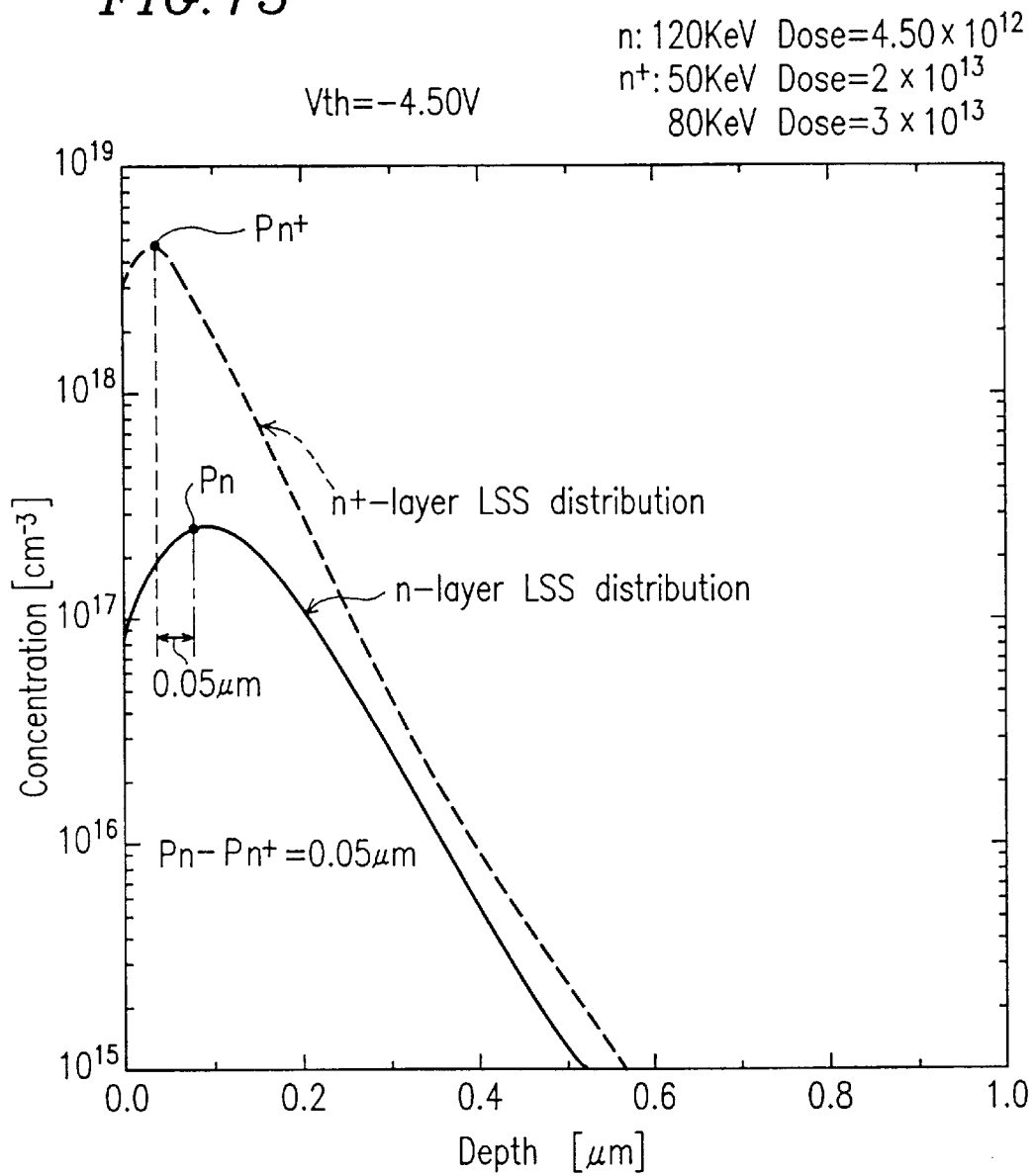
FIG. 15 is an LSS distribution diagram observed when the acceleration energy at the n-layer ion implantation is 120 keV.
Figure 16:
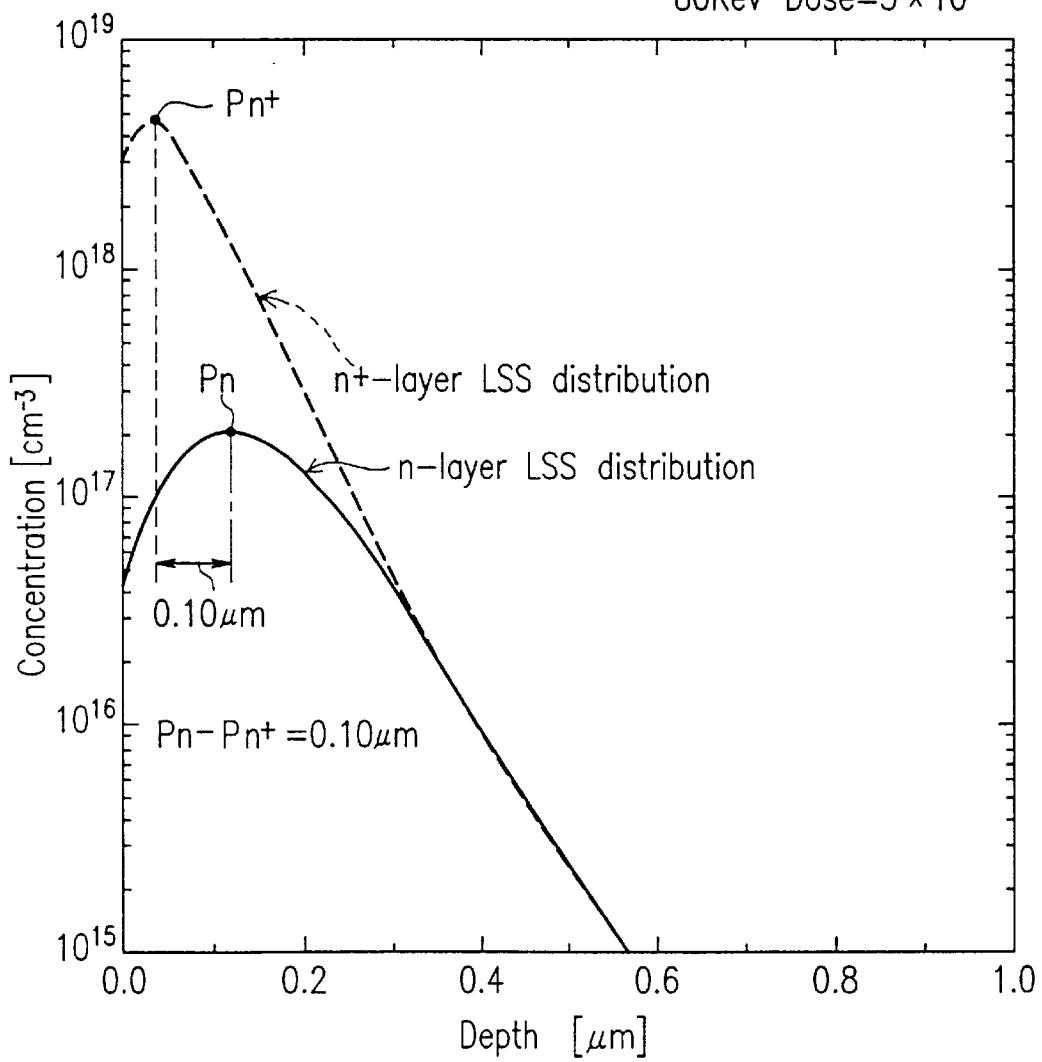
FIG. 16 is an LSS distribution diagram observed when the acceleration energy at the n-layer ion implantation is 150 keV.

FIGS. 14 to 16 show results of the simulation of the n-layer ion implantation profile peak position based on a Lindhard Scharff and Schiott (LSS) theory. FIG. 14 shows an LSS distribution when the acceleration energy at the n-layer ion implantation is 80 keV. FIG. 15 shows an LSS distribution when the acceleration energy at the n-layer ion implantation is 120 keV. FIG. 16 shows an LSS distribution when the acceleration energy at the n-layer ion implantation is 150 keV.

Specifically, FIGS. 14 to 16 show the variation in an n-layer ion implantation profile peak position Pn when the ion implantation condition for the n-layer is varied. As the acceleration energy at the n-layer ion implantation is larger, the n-layer ion implantation profile peak position Pn moves rightward as is viewed from the graph, i.e., the n-layer ion implantation profile position from the substrate surface becomes deeper. At this time, the threshold voltage $V_{th}$ is fixed at −4.5 V, and the conditions for the ion implantation for the $n^+$-layer which is two-stage implantation are fixed at, for the first implantation, acceleration energy: 50 keV
ion dose amount: $2 \times 10^{13}$ ions/cm$^2$ and for the second implantation, acceleration energy: 80 keV
ion dose amount: $3 \times 10^{13}$ ions/cm$^2$.

It is observed from FIG. 14 that, when the acceleration energy at the n-layer ion implantation is 80 keV, the depth of the n-layer ion implantation profile position Pn is equal to the depth of the $n^+$-layer ion implantation profile position $Pn^+$.

It is observed from FIG. 15 that, when the acceleration energy at the n-layer ion implantation increases to 120 keV, the depth of the n-layer ion implantation profile position Pn moves rightward as is viewed from the graph, exceeding the depth of the $n^+$-layer ion implantation profile position $Pn^+$ by 0.05 µm.

It is observed from FIG. 16 that, when the acceleration energy at the n-layer ion implantation further increases to 150 keV, the depth of the n-layer ion implantation profile position Pn further moves rightward as is viewed from the graph, exceeding the depth of the $n^+$-layer ion implantation profile position $Pn^+$ by 0.10 µm.

Thus, as the acceleration energy at the n-layer ion implantation is larger, the n-layer ion implantation profile peak position Pn becomes deeper. As the n-layer ion implantation profile peak position Pn is deeper, the carrier concentration of the lower portion of the $n^+$-layer becomes high compared with the case where the n-layer is shallower than the $n^+$-layer. As the carrier concentration of the lower portion of the $n^+$-layer is high, the amount of parasitic components at the interface between the n-layer and the $n^+$-layer decreases, thereby improving the RF characteristics of the amplifier semiconductor element FET1.

Moreover, as the depth hn of the n-layer 1 becomes large, the current density of the amplifier semiconductor element FET1 at the operation decreases. This increases the DC withstand voltage of the amplifier semiconductor element FET1. Specifically, a gate peak inverse voltage $BV_{gd}$@ 1 g=−2.5 µA (Vd=0 V) of the amplifier semiconductor element FET1 having the ion implantation profile described in this example was evaluated, and it was found that the DC withstand voltage had improved by 20% at maximum.

Figure 17:
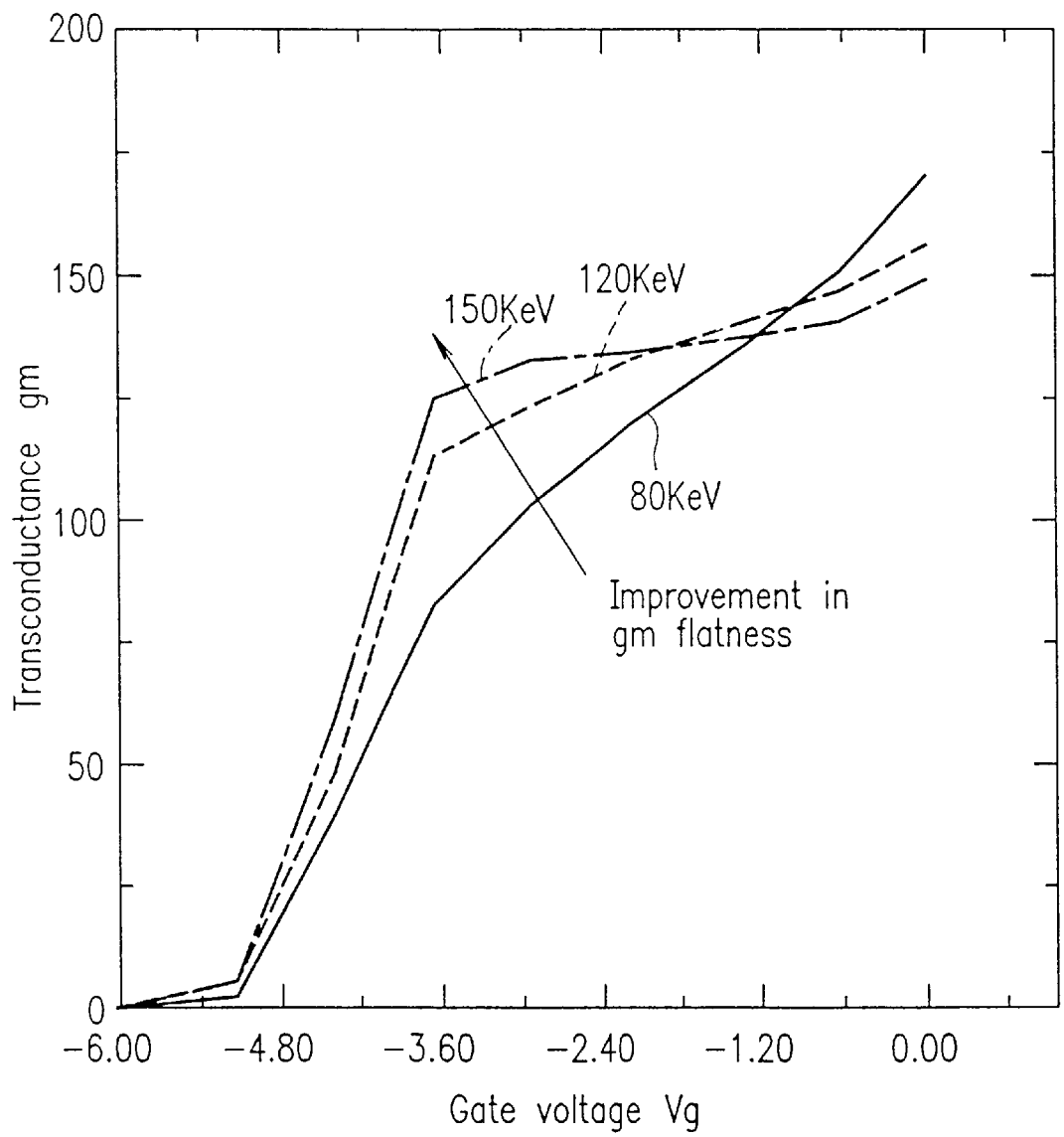
FIG. 17 is a graph for explaining the dependency of the gate voltage-transconductance ($V_g$-gm) curve on the n-layer ion implantation energy of the amplifier semiconductor element of FIG. 1.

FIG. 17 is a graph for explaining the dependency of the gate voltage—transconductance ($V_g$-gm) curve on the n-layer ion implantation energy. In the amplifier semiconductor element FET1, the flatness of the transconductance gm with respect to the gate voltage $V_g$ improves as the acceleration energy at the n-layer ion implantation increases from 80 keV to 120 keV and further to 150 keV.

As previously described, although IEICE Trans. Electron., Vol. E78C, No. 9, pp. 1241–1245, September 1995 describes that the flatter the dependency of the transconductance gm on the gate bias $V_g$ is, the better the linearity is, the transconductance gm of the actual amplifier semiconductor element at the operation point is not necessarily flat, and thus whether or not the linearity actually becomes better is unknown. From the results of the above-described simulation, however, it has been found that the flatness of the transconductance gm improves when the depth of the n-layer from the substrate surface is made larger than the depth of the $n^+$-layer from the substrate surface as in the amplifier semiconductor element FET1.

When the acceleration energy at the n-layer ion implantation is 80 keV, the flatness of the transconductance gm is poor as shown in FIG. 17, and thus no improvement on the RF characteristics of the amplifier semiconductor element FET1 is obtained. On the contrary, when the acceleration energy at the n-layer ion implantation increases to exceed 150 keV, the flatness of the transconductance gm becomes better, improving the RF characteristics. In this case, however, since a source-drain current $I_{dss}$ decreases greatly, no improvement on the performance of the amplifier semiconductor element FET1 as a whole is expected. To overcome this problem, the n-layer ion implantation profile peak position Pn is preferably deeper than the n⁺-layer ion implantation profile peak position Pn⁺ by 0.04 μm to 0.10 μm. The acceleration energy at the n-layer ion implantation is preferably in the range of 100 keV to 150 keV.

Thus, in this example according to the present invention, the RF characteristics and the withstand voltage of the amplifier semiconductor element FET1 can be improved only by shifting the n-layer ion implantation profile peak position Pn farther toward the inside of the substrate than the n⁺-layer ion implantation profile peak position Pn⁺, i.e., by increasing the acceleration energy at the n-layer ion implantation compared with the acceleration energy at the n⁺-layer ion implantation. Since only increasing the acceleration energy at the n-layer ion implantation is required, no additional step is necessary for the fabrication process of the amplifier semiconductor element FET1. Moreover, since no etching of the operation layer is required for improving the withstand voltage as in the conventional technique, the amplifier semiconductor element can be fabricated efficiently and stably.

Figure 18:
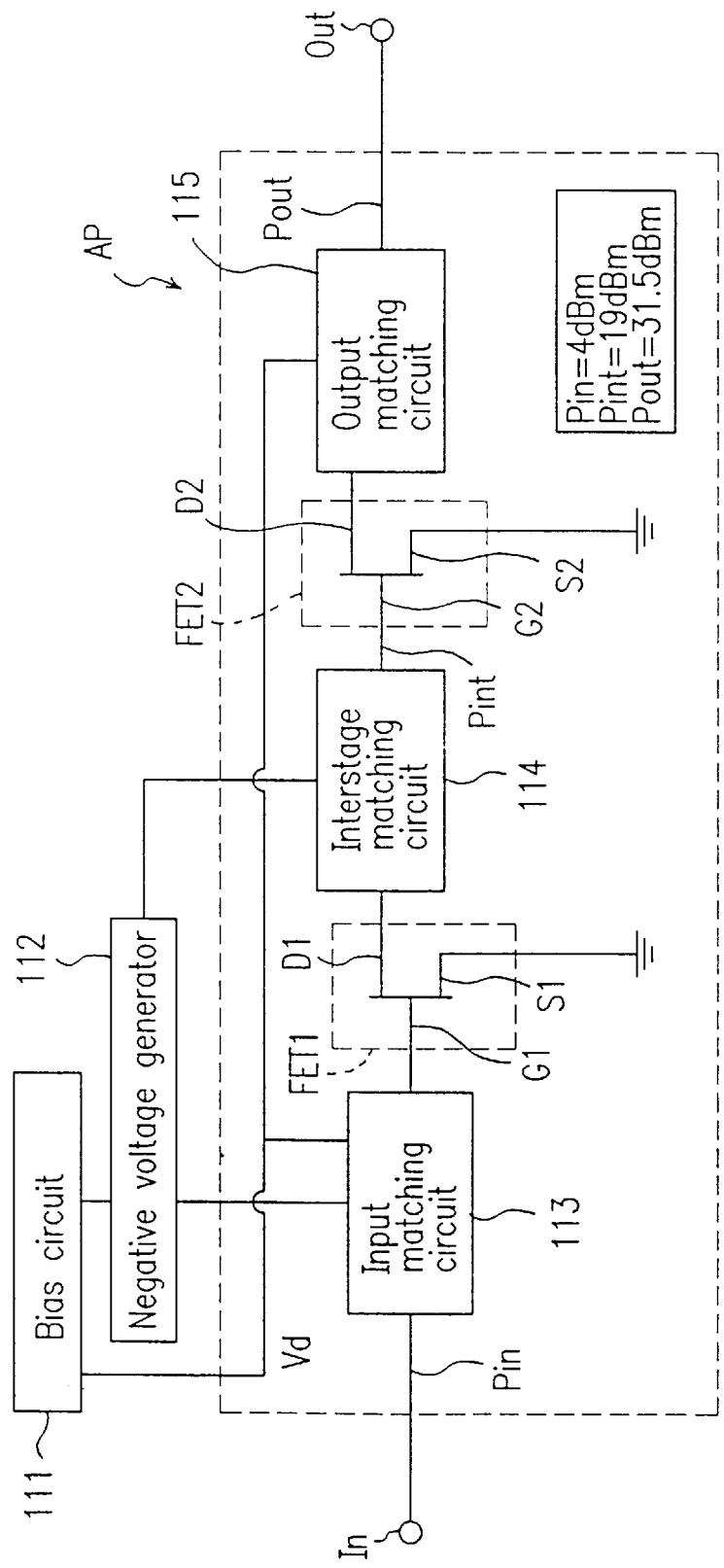
FIG. 18 is a block diagram of an amplifier semiconductor device according to the present invention.
Figure 19:
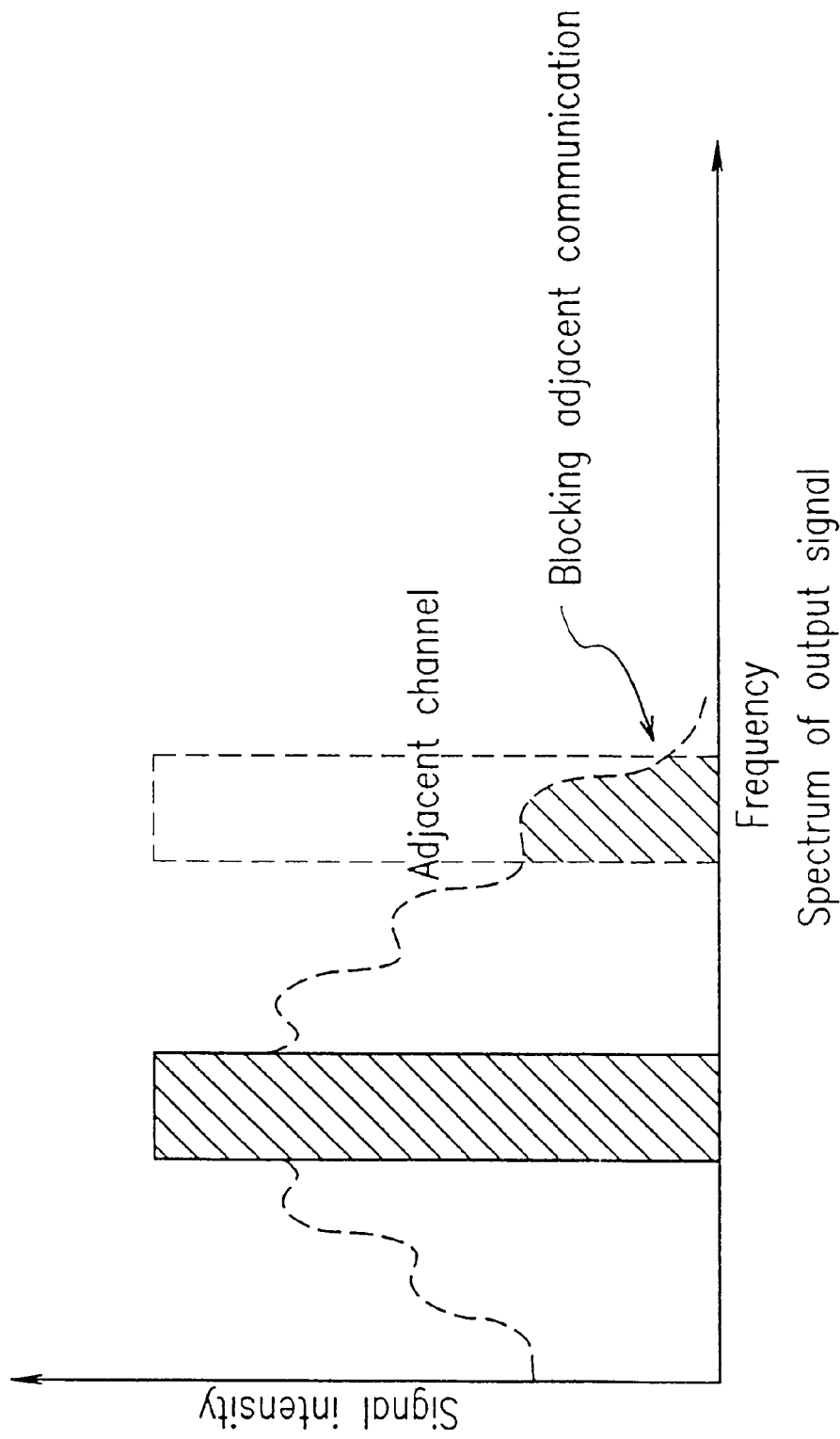
FIG. 19 is a graph for explaining the physical effect of the adjacent channel leakage power.

FIG. 18 shows a configuration of the amplifier semiconductor device AP which includes amplifier semiconductor elements FET1 and FET2. The amplifier semiconductor element FET1 has a gate G1, a drain D1, and a source S1. The amplifier semiconductor element FET2 has a gate G2, a drain D2, and a source S2. The amplifier semiconductor device AP further includes an input matching circuit 113 and an interstage matching circuit 114. The input matching circuit 113 is connected with an input terminal In, a negative voltage generator 112, a bias circuit 111, and the gate G1 of the amplifier semiconductor element FET1. The interstage matching circuit 114 is connected with the drain D1 of the amplifier semiconductor element FET1, the gate G2 of the amplifier semiconductor element FET2, and the negative voltage generator 112. The amplifier semiconductor device AP further includes an output matching circuit 115. The output matching circuit 115 is connected with the drain D2 of the amplifier semiconductor element FET2, the bias circuit 111, and an output terminal Out.

The input matching circuit 113, the interstage matching circuit 114, and the output matching circuit 115 realize the RF impedance matching. When an optimal gate negative bias generated by the negative voltage generator 112 is applied to the gate G1 of the amplifier semiconductor element FET1 and the gate G2 of the amplifier semiconductor element FET2, an additional efficiency of 47% (Gp= 23 dB) is obtained under the following conditions.

Pinch-off voltage of FET1: −3.7V

Pinch-off voltage of FET2: −3.7V

Drain voltage: 3.0V

Gate voltage: −5.6V

Adjacent channel leakage power <−60 dBm

Pout: 81.5 dBm

As described above, in this example, an amplifier semiconductor device using an amplifier semiconductor element which is adapted to a reduced power voltage and achieves high efficiency, high withstand voltage, and low cost while satisfying the conditions for the adjacent channel leakage power is provided.

Thus, according to the present invention, the amplifier semiconductor element which can operate at high efficiency while suppressing the adjacent channel leakage power below a specified value, the method for fabricating such an amplifier semiconductor element at low cost, and the amplifier semiconductor device using such an amplifier semiconductor element are provided.

Also, according to the present invention, the amplifier semiconductor element having high withstand voltage, the method for fabricating such an amplifier semiconductor element, and the amplifier semiconductor device using such an amplifier semiconductor element are provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An amplifier semiconductor element, comprising:

a semi-insulating GaAs substrate;

an n-layer formed in a surface portion of the substrate; and n⁺-layers formed in a surface portion of the substrate on both sides of the n-layer, wherein an ion implantation profile peak position of the n-layer is deeper than an ion implantation Profile peak position of the n⁺-layers, the amplifier semiconductor element including a field effect transistor which is a GaAs MESFET of which a threshold voltage $V_{th}$ has a predetermined relationship with an operating voltage, and which operates in a depletion-mode, and wherein the ion implantation profile peak position of the n-layer is deeper than the ion implantation profile peak position of the n⁺-layer by 0.04 μm to 0.10 μm.

2. The amplifier semiconductor element according to claim 1, wherein the threshold voltage $V_{th}$ is in the range of −2.5 V to −4.5 V.

3. The amplifier semiconductor element according to claim 2, wherein the operating voltage is a drain voltage $V_{dr}$, and the predetermined relationship includes a relationship of $V_{dr} \leq |V_{th}|$.

4. The amplifier semiconductor element according to claim 3, wherein the drain voltage $V_{dr}$ is in the range of 1.0 V to 3.5 V.

5. The amplifier semiconductor element according to claim 4, wherein the predetermined relationship further includes a relationship of $V_{dr} \leq 4|V_{th}|-9$.

* * * * *